(12) United States Patent
Lim et al.

(10) Patent No.: US 10,855,012 B2
(45) Date of Patent: Dec. 1, 2020

(54) ELECTRONIC DEVICE FOR SUPPORTING USB INTERFACE AND METHOD FOR CONTROLLING USB INTERFACE

(71) Applicant: Samsung Electronics Co., Ltd., Gyeonggi-do (KR)

(72) Inventors: Ho-yeong Lim, Gyeonggi-do (KR); Kyu-hyuck Kwak, Gyeonggi-do (KR); Du-hyun Kim, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 144 days.

(21) Appl. No.: 16/072,064

(22) PCT Filed: Jan. 17, 2017

(86) PCT No.: PCT/KR2017/000543
§ 371 (c)(1),
(2) Date: Jul. 23, 2018

(87) PCT Pub. No.: WO2017/142211
PCT Pub. Date: Aug. 24, 2017

(65) Prior Publication Data
US 2019/0036257 A1 Jan. 31, 2019

(30) Foreign Application Priority Data
Feb. 16, 2016 (KR) .......... 10-2016-0017784

(51) Int. Cl.
*G06F 13/40* (2006.01)
*H01R 13/05* (2006.01)
(Continued)

(52) U.S. Cl.
CPC ....... *H01R 13/052* (2013.01); *G01R 27/2605* (2013.01); *G06F 1/266* (2013.01);
(Continued)

(58) Field of Classification Search
CPC .... G06F 1/266; G06F 13/385; G06F 13/4282; G06F 13/4068; G06F 2213/0042
See application file for complete search history.

(56) References Cited

U.S. PATENT DOCUMENTS 7,635,280 B1 12/2009 Crumlin et al.
9,400,546 B1 * 7/2016 Agarwal ............. G06F 13/4068
(Continued)

FOREIGN PATENT DOCUMENTS

| CN | 204481220 U | 7/2015 |
|---|---|---|
| EP | 3 104 280 A1 | 12/2016 |
| KR | 10-2016-0145414 A | 12/2016 |

OTHER PUBLICATIONS

International Search Report; dated Apr. 28, 2017.
(Continued)

*Primary Examiner* — Brian T Misiura
(74) *Attorney, Agent, or Firm* — Cha & Reiter, LLC.

(57) ABSTRACT

An electronic device supporting a universal serial bus (USB) interface operating according to various embodiments includes: a housing; an opening provided in a part of the housing; a receptacle arranged in the opening and including a pin mounting portion where a plurality of first receptacle pins and a plurality of second receptacle pins are provided; and a control circuit for sensing a connection between the receptacle and an external connector, wherein, when the connection between the receptacle and the external connector is sensed, the control circuit may apply a predetermined current to any one of the plurality of first receptacle pins and the plurality of second receptacle pins.

Various other embodiments are possible.

15 Claims, 17 Drawing Sheets

(51) Int. Cl.
    *G06F 11/30*     (2006.01)
    *G06F 1/26*     (2006.01)
    *G06F 13/38*     (2006.01)
    *G06F 13/14*     (2006.01)
    *H01R 13/66*     (2006.01)
    *G01R 27/26*     (2006.01)
    *G06F 13/20*     (2006.01)
    *H01R 13/627*     (2006.01)
    *H01R 24/60*     (2011.01)

(52) U.S. Cl.
    CPC .............. *G06F 11/30* (2013.01); *G06F 13/14* (2013.01); *G06F 13/20* (2013.01); *G06F 13/385* (2013.01); *G06F 13/40* (2013.01); *G06F 13/4063* (2013.01); *G06F 13/4081* (2013.01); *H01R 13/6683* (2013.01); *H01R 13/6273* (2013.01); *H01R 24/60* (2013.01)

(56) References Cited

U.S. PATENT DOCUMENTS

| | | | | |
|---|---|---|---|---|
| 9,652,049 | B2 * | 5/2017 | Song | H01H 13/48 |
| 9,823,286 | B2 * | 11/2017 | Connell | G01R 31/00 |
| 9,904,267 | B2 * | 2/2018 | Tupala | G06F 1/266 |
| 9,996,130 | B2 * | 6/2018 | Rhee | H01R 29/00 |
| 10,168,378 | B2 * | 1/2019 | Kim | G06F 11/00 |
| 10,320,128 | B2 * | 6/2019 | Hijazi | H01R 13/6595 |
| 2012/0119696 | A1 | 5/2012 | Picard | |
| 2015/0229161 | A1 | 8/2015 | Talmola et al. | |
| 2015/0293514 | A1 * | 10/2015 | Tupala | G06F 1/266 |
| | | | | 700/295 |
| 2015/0331826 | A1 | 11/2015 | Ghosh et al. | |
| 2016/0364360 | A1 | 12/2016 | Lim | |
| 2019/0312448 | A1 * | 10/2019 | Lim | H02J 7/007 |
| 2020/0042474 | A1 * | 2/2020 | Jo | G06F 13/4282 |

OTHER PUBLICATIONS

Written Opinion of the International Searching Authority; dated Apr. 28, 2017.

Andrew Rogers; Microchip Technology Inc. "Introduction to USB Type-C", 2015. <http://ww1.microchip.com/downloads/en/AppNotes/00001953A.pdf> See p. 2, section1.2.1; p. 3, figure 2; p. 10, section 3.4; and p. 12, section 3.6.

Universal Serial Bus Type-C Cable and Connector Specification; Release 1.0, Aug. 11, 2014.

Universal Serial Bus Type-C Cable and Connector Specification; Release 1.1—Redline from 1.0; Revision Apr. 3, 2015.

* cited by examiner

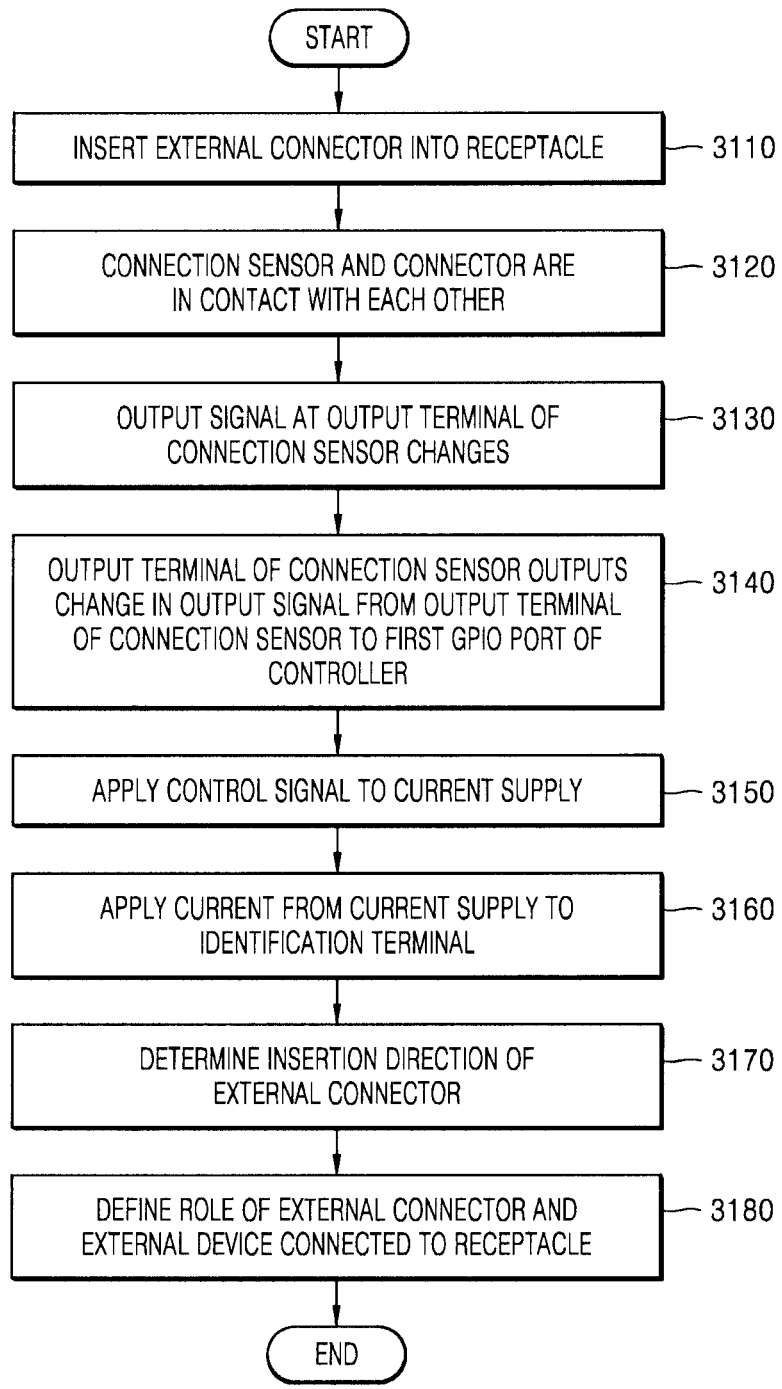

ELECTRONIC DEVICE FOR SUPPORTING USB INTERFACE AND METHOD FOR CONTROLLING USB INTERFACE

CLAIM OF PRIORITY

This application is a National Phase Entry of PCT International Application No. PCT/KR2017/000543, which was filed on Jan. 17, 2017 and claims a priority to Korean Patent Application No. 10-2016-0017784, which was filed on Feb. 16, 2016, the contents of which are incorporated herein by reference.

TECHNICAL FIELD

The present disclosure relates to an electronic device configured to communicate with an external device via a universal serial bus (USB).

BACKGROUND ART

A universal serial bus (USB) is an industrial standard data bus standard that may be used to transfer digital data between electronic devices. A USB 3.1 type, which is widely used recently, is 10 times faster than a USB 2.0 type and is suitable for high-definition content transmission. In addition, in a case of the USB 3.1 type, the role of an external device connected to each connector, that is, a USB host or a USB device, may be relatively determined.

DESCRIPTION OF EMBODIMENTS

Technical Problem

In a universal serial bus (USB) 3.1 type, a predetermined current is periodically applied to an identification terminal to define the role of an external device connected to each connector. Accordingly, when moisture is introduced into the connector from the outside, the identification terminal may corrode, and unnecessary power consumption may occur.

Various embodiments of the present disclosure provide a method of controlling a USB interface capable of controlling a current applied to an identification terminal according to whether a receptacle is connected to an external connector, and an electronic device supporting the same.

Solution to Problem

In accordance with an aspect of the present disclosure, an electronic device supporting a USB interface includes: a housing; an opening provided in a part of the housing; a receptacle, which is arranged in at least a part of the inside of the opening, including a first surface and a second surface that are parallel to each other, and a plurality of first receptacle pins and a plurality of second receptacle pins respectively arranged on the first surface and the second surface, wherein the plurality of first receptacle pins and the plurality of second receptacle pins are symmetrically arranged with respect to a center portion of the receptacle; and a control circuit, which is electrically connected to at least one of the plurality of first receptacle pins and the plurality of second receptacle pins, configured to sense whether an external connector including first external connector pins and second external connector pins symmetrical to each other is inserted into the receptacle, to apply a predetermined current to any one of the plurality of first receptacle pins and the plurality of second receptacle pins when sensing that the external connector has been inserted into the receptacle, to monitor the predetermined current, and to sense a connection between the first external connector pin and one of the plurality of first receptacle pins and the plurality of second receptacle pins according to the monitored predetermined current.

In accordance with another aspect of the present disclosure, a method of controlling a USB interface includes: inserting an external connector into a receptacle; contacting, by a connector provided in the external connector, to a connection sensor provided in the receptacle; changing an output signal at an output terminal of the connection sensor; outputting a change of the output signal to a controller; applying, by the controller, a control signal to a current supply; and applying, by the current supply, a current to an identification terminal.

BRIEF DESCRIPTION OF DRAWINGS

FIG. 9B is a flowchart of a method of controlling an electronic device supporting a USB interface operating according to various embodiments of the present disclosure.

MODE OF DISCLOSURE

Figure 1:
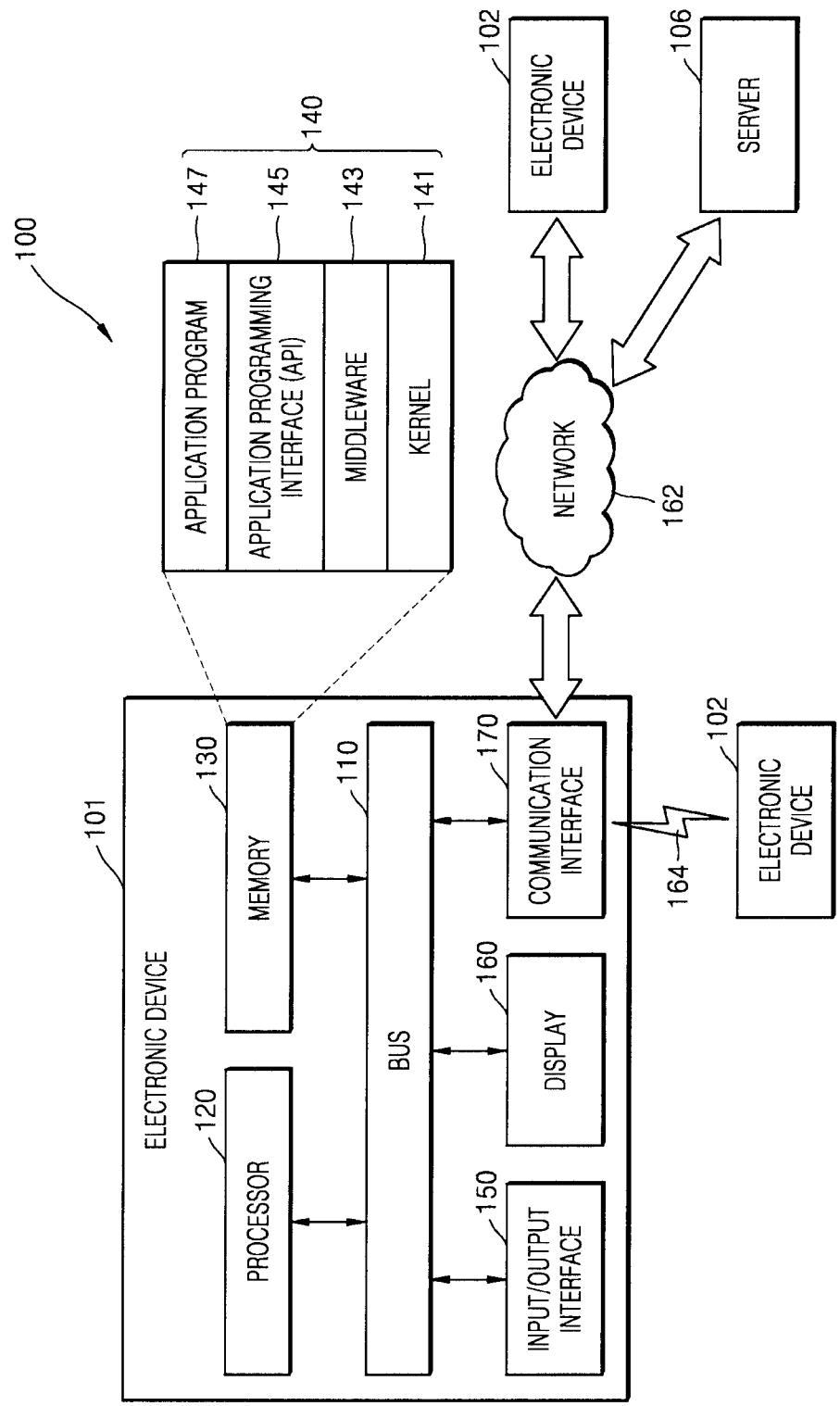
FIG. 1 is a block diagram of a network environment according to various embodiments of the present disclosure.

Hereinafter, one or more embodiments will be described more fully with reference to the accompanying drawings. However, this does not limit the present disclosure to specific embodiments, and it should be understood that the present disclosure covers all the modifications, equivalents and replacements included within the idea and technical scope of the present disclosure. Similar reference numerals are assigned to similar elements throughout the specification. As used herein, the singular forms "a", "an", and "the" are intended to include the plural forms as well, unless the context clearly indicates otherwise. In the specification, the terms "A or B" or "at least one of A and/or B" and the like may include all possible combinations of the items listed together. It will be understood that although the terms "first", "second", "third", etc. may be used herein to describe various components, these components should not be limited by these terms. Further, when it is described that one element (e.g., first element) is "connected" or "accesses" the other element (e.g., second element), it is understood that the one element may be directly connected to or may directly access the other element but unless explicitly described to the contrary, another element (e.g., third element) may be "connected" or "access" between the elements.

In the specification, "configured to~" may be used interchangeably, either hardware or software, with, for example, "adapted to," "capable of," "modified to," "made to," or "designed to", depending on the situation. In some situations, the term "a device configured to~" may mean that the device "capable of~" with other devices or components. For example, the phrase "a processor configured to perform A, B, and C operations" may refer to a dedicated processor (e.g., embedded processor) for performing the operations, or a general purpose processor (e.g., central processing unit (CPU) or application processor) capable of performing the operations by executing one or more software programs stored in a memory device.

An electronic device according to various embodiments of the specification may include at least one of, for example, smart phones, tablet personal computers (PCs), mobile phones, video telephones, E-book readers, desktop PCs, laptop PCs, netbook computers, workstations, portable multimedia players (PDAs), MP3 players, medical devices, cameras, and wearable devices. A wearable device may include at least one of accessory type devices (e.g., watches, rings, bracelets, braces, necklaces, glasses, or contact lenses, or a head-mounted device (HMD)), textile or garment-integrated devices (e.g., an electronic apparel), body-attachment devices (e.g., a skin pad or tattoos), or implantable circuits. In some embodiments, the electronic device may include at least one of, for example, televisions (TVs), digital video disk (DVD) players, audio players, refrigerators, air conditioners, vacuum cleaners, ovens, microwave ovens, washing machines, air purifiers, set-top boxes, home automation control panels, security control panels, media boxes (e.g., Samsung HomeSync™, Apple TV™, or Google TV™), game consoles (e.g., Xbox™, PlayStation™), electronic dictionaries, electronic keys, camcorders, or electronic photo frames.

In another embodiment, the electronic device may include at least one of, for example, various medical devices (e.g., various portable medical measuring instruments (such as blood glucose meters, heart rate meters, blood pressure meters, or body temperature meters), magnetic resonance angiography (MRA), magnetic resonance imaging (MRI), computed tomography (CT), cameras, or ultrasound devices), navigation devices, a global navigation satellite system (GNSS), an event data recorder (EDR), a flight data recorder (FDR), automotive infotainment devices, marine electronic devices (e.g., marine navigation devices, gyro compasses, etc.), avionics, security devices, car head units, industrial or household robots, drones, automatic teller's machines (ATMs) at financial institutions, point of sale (POS) of stores, or Internet of Things (IoT) devices (e.g., light bulbs, various sensors, sprinkler devices, fire alarms, thermostats, street lights, toasters, exercise equipment, hot water tanks, heaters, boilers, etc.). According to some embodiments, the electronic device may include at least one of a portion of furniture, a building/structure, or an automobile, an electronic board, an electronic signature receiving device, a projector, or any of a variety of metering devices (e.g., water, electricity, gas, or a radio wave measuring instrument). In various embodiments, the electronic device is flexible or may be a combination of two or more of the various devices described above. The electronic device according to the embodiment is not limited to the above-described devices. In the specification, the term user may refer to a person using an electronic device or a device using the electronic device (e.g., an artificial intelligence electronic device).

Referring to FIG. 1, an electronic device 101 in a network environment 100 in various embodiments is described. The electronic device 101 may include a bus 110, a processor 120, a memory 130, an input/output interface 150, a display 160, and a communication interface 170. In some embodiments, the electronic device 101 may omit at least one of the elements, or may additionally include other elements. The bus 110 may include a circuit for connecting the components 110 to 170 to one another and for performing communication (e.g., control message or data) between the components. The processor 120 may include at least one of a CPU, an application processor, or a communications processor (CP). The processor 120 may perform operations or data processing related to, for example, control and/or communication of at least one of other components of the electronic device 101.

The memory 130 may include volatile and/or non-volatile memory. For example, the memory 130 may store command or data related to at least one of other components of the electronic device 101. According to an embodiment, the memory 130 may store software and/or a program 140. The program 140 may include, for example, a kernel 141, middleware 143, an application programming interface (API) 145, and/or an application program (or "application") 147. At least some of the kernel 141, the middleware 143, or the API 145 may be referred to as an operating system. The kernel 141 may control or manage system resources (e.g., the bus 110, the processor 120, or the memory 130) used to execute operation or functions implemented in other programs (e.g., the middleware 143, the API 145, or the application program 147). Furthermore, the kernel 141 may provide an interface for controlling or managing system resources by accessing individual components of the electronic device 101 in the middleware 143, the API 145, or the application program 147.

The middleware 143 may perform an intermediary role such that the API 145 or the application program 147 may communicate with the kernel 141 to exchange data. In addition, the middleware 143 may process one or more task requests received from the application program 147 in a priority order. For example, the middleware 143 may prioritize at least one of application programs 147 to use system resources (e.g., the bus 110, the processor 120, or the memory 130) of the electronic device 101, and may process the one or more task requests. The API 145 is an interface for the application 147 to control functions provided by the kernel 141 or the middleware 143 and may include, for example, at least one interface or function (e.g., instruction) for file control, window control, image processing, or character control. The input/output interface 150 may transmit commands or data received from a user or other external device to another component(s) of the electronic device 101 or may output the commands or data received from other component(s) of the electronic device 101 to the user or other external device.

The display 160 may include, for example, a liquid crystal display (LCD), a light-emitting diode (LED) display, an organic light-emitting diode (OLED) display, a micro electro mechanical system (MEMS) display, or an electronic paper display. The display 160 may display, for example, various pieces of content (e.g., text, images, video, icons, and/or symbols, etc.) to a user. The display 160 may include a touch screen and may receive, for example, a touch, a gesture, a proximity, or a hovering input using an electronic pen or a portion of a user's body. The communication interface 170 may set communication between, for example, the electronic device 101 and an external device (e.g., a first external electronic device 102, a second external electronic device 104, or a server 106). For example, the communication interface 170 may be connected to a network 162 via wireless or wired communication to communicate with an external device (e.g., the second external electronic device 104 or the server 106).

The wireless communication may include cellular communication using, for example, at least one of long-term evolution (LTE), LTE advance (LTE-A), code division multiple access (CDMA), wideband CDMA (WCDMA), universal mobile telecommunications system (UMTS), wireless broadband (WiBro), and global system for mobile communications (GSM). According to an embodiment, the wireless communication may include, for example, at least one of wireless fidelity (WiFi), Bluetooth, Bluetooth low energy (BLE), ZigBee, near-field communication, magnetic secure transmission, radio frequency (RF), and body area network (BAN). According to an embodiment, the wireless communication may include GNSS. GNSS may be, for example, global positioning system (GPS), global navigation satellite system (Glonass), Beidou navigation satellite system (Beidou), Galileo, or the European global satellite-based navigation system. Hereinafter, in the specification, "GPS" may be used interchangeably with "GNSS". The wired communication may include at least one of, for example, USB, high definition multimedia interface (HDMI), recommended standard 232 (RS-232), power line communication, or plain old telephone service (POTS). The network 162 may include a telecommunication network such as at least one of a computer network (e.g., a wired local area network (LAN) or a wide area network (WAN)), the Internet, or a telephone network.

Each of the first and second external electronic devices 102 and 104 may be the same or a different kind of device as the electronic device 101. According to various embodiments, all or some operations performed in the electronic device 101 may be performed in another electronic device or a plurality of electronic devices (e.g., the electronic devices 102 and 104, or the server 106). According to an embodiment, when the electronic device 101 has to perform certain functions or services automatically or upon request, the electronic device 101 may request other devices (e.g., the electronic devices 102 and 104, or the server 106) to perform at least some functions associated with the above functions or services instead of or in addition to executing the above functions or services. Other electronic devices (e.g., the electronic devices 102 and 104, or the server 106) may execute the requested functions or additional functions and transmit the result to the electronic device 101. The electronic device 101 may directly or additionally process the received result to provide the requested functions or services. For this purpose, for example, cloud computing, distributed computing, or client-server computing technology may be used.

Figure 2:
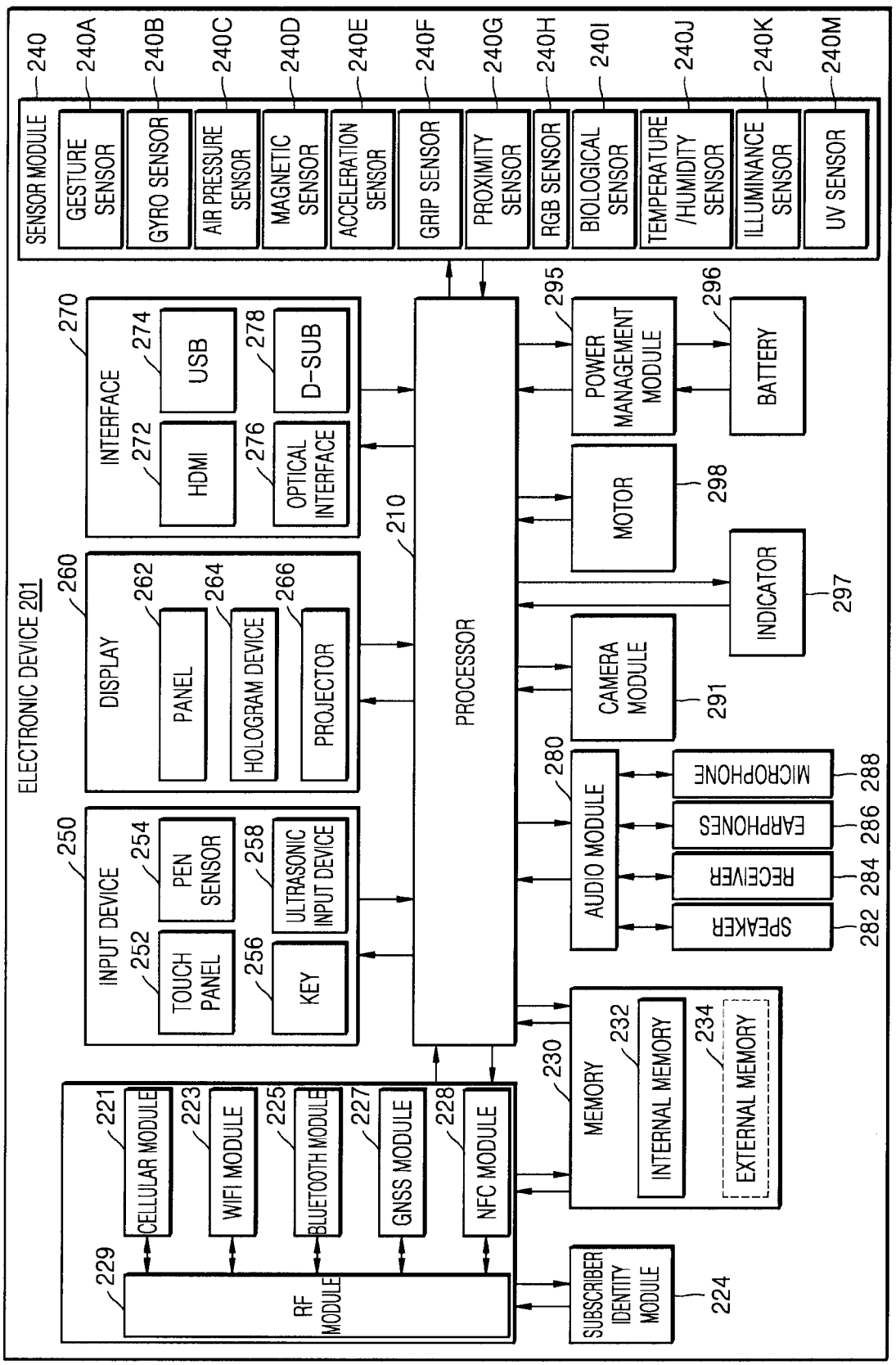
FIG. 2 is a block diagram of an electronic device according to various embodiments of the present disclosure.

FIG. 2 is a block diagram of an electronic device 201 according to various embodiments of the present disclosure. The electronic device 201 may include, for example, all or some of the electronic device 101 shown in FIG. 1. The electronic device 201 may include one or more processors (e.g., AP) 210, a communication module 220, a subscriber identity module 224, a memory 230, a sensor module 240, an input device 250, a display 260, an interface 270, an audio module 280, a camera module 291, a power management module 295, a battery 296, an indicator 297, and a motor 298. The processor 210 may, for example, execute an operating system or application program to control a plurality of hardware or software components connected to the processor 210, and may perform various data processing and operations. The processor 210 may be implemented with, for example, system on chips (SoCs). According to an embodiment, the processor 210 may further include a graphics processing unit (GPU) and/or an image signal processor. The processor 210 may include at least some of the elements shown in FIG. 2 (e.g., a cellular module 221). The processor 210 may load commands or data received from at least one of the other elements (e.g., nonvolatile memory) into a volatile memory and process the commands or data, and may store the resulting data in a nonvolatile memory.

The processor 210 may have the same or similar configuration as the communication module 220 (e.g., the communication interface 170). The communication module 220 may include, for example, the cellular module 221, a WiFi module 223, a Bluetooth module 225, a GNSS module 227, an NFC module 228, and an RF module 229. The cellular module 221 may provide, for example, voice calls, video calls, text services, or Internet services via a communication network. According to an embodiment, the cellular module 221 may use the subscriber identity module (e.g., subscriber identity module (SIM) card) 224 to perform identification and authentication of the electronic device 201 within the communication network. According to an embodiment, the cellular module 221 may perform at least some functions that the processor 210 may provide. According to an embodiment, the cellular module 221 may include a communication processor (CP). According to some embodiments, at least some (e.g., two or more) of the cellular module 221, the WiFi module 223, the Bluetooth module 225, the GNSS module 227, and the NFC module 228 may be included in one integrated chip (IC) or an IC package. The RF module 229 may, for example, transmit and receive communication signals (e.g., RF signals). The RF module 229 may include, for example, a transceiver, a power amplifier module (PAM), a frequency filter, a low noise amplifier (LNA), or an antenna. According to another embodiment, at least one of the cellular module 221, the WiFi module 223, the Bluetooth module 225, the GNSS module 227, and the NFC module 228 may transmit and receive RF signals through a separate RF module. The subscriber identity module 224 may include, for example, a card or an embedded SIM containing a subscriber identity module, and may further include unique identity information (e.g., integrated circuit card identifier (ICCID)) or subscriber information (e.g., international mobile subscriber identity (IMSI)).

The memory 230 (e.g., the memory 130) may include, for example, an internal memory 232 or an external memory 234. The internal memory 232 may include, for example, at least one of a volatile memory (e.g., dynamic random access memory (DRAM), static random access memory (SRAM), synchronous DRAM (SDRAM), or the like), a nonvolatile memory (e.g., one-time programmable read-only memory (OTPROM), programmable ROM (PROM), erasable and programmable ROM (EPROM), electrically erasable and programmable ROM (EEPROM), mask ROM, flash ROM, or the like), a flash memory, a hard-disk drive (HDD), and a solid-state drive (SSD). The external memory 234 may include a flash drive such as compact flash (CF), secure digital (SD), micro-SD, mini-SD, extreme digital (xD), a multi-media card (MMC), or a memory stick. The external memory 234 may be functionally or physically connected to the electronic device 201 via various interfaces.

The sensor module 240 may, for example, measure a physical quantity or sense an operating state of the electronic device 201 to convert the measured or sensed information into an electrical signal. The sensor module 240 may include, for example, at least one of a gesture sensor 240A, a gyro sensor 240B, an air pressure sensor 240C, a magnetic sensor 240D, an acceleration sensor 240E, a grip sensor 240F, a proximity sensor 240G, a color sensor 240H (e.g., RGB (red, green, blue) sensor), a biological sensor 240I, a temperature/humidity sensor 240J, an illuminance sensor 240K, or an ultra-violet (UV) sensor 240M. Additionally or alternatively, the sensor module 240 may include, for example, an e-nose sensor, an electromyography (EMG) sensor, an electroencephalogram (EEG) sensor, an electrocardiogram sensor, an infrared (IR) sensor, an iris sensor, and/or a fingerprint sensor. The sensor module 240 may further include a control circuit for controlling one or more sensors of the sensor module 240. In some embodiments, the electronic device 201 further includes a processor configured to control the sensor module 240, either as a part of the processor 210 or separately, so that the electronic device 201 may control the sensor module 240 while the processor 210 is in a sleep state.

The input device 250 may include, for example, a touch panel 252, a (digital) pen sensor 254, a key 256, or an ultrasonic input device 258. As the touch panel 252, for example, at least one of an electrostatic type, a pressure sensitive type, an IR type, and an ultrasonic type may be used. Further, the touch panel 252 may further include a control circuit. The touch panel 252 may further include a tactile layer to provide a tactile response to a user. The (digital) pen sensor 254 may be a part of, for example, a touch panel or may include a separate recognition sheet. The key 256 may include, for example, a physical button, an optical key, or a keypad. The ultrasonic input device 258 may sense an ultrasonic generated from an input tool through a microphone (e.g., a microphone 288) and confirm data corresponding to the sensed ultrasonic.

The display 260 (e.g., the display 160) may include a panel 262, a hologram device 264, a projector 266, and/or a control circuit for controlling them. The panel 262 may be implemented, for example, flexibly, transparently, or wearably. The panel 262 may include the touch panel 252 and one or more modules. The hologram device 264 may display a stereoscopic image in the air using the interference of light. The projector 266 may display an image by projecting light onto a screen. The screen may, for example, be located inside or outside the electronic device 201. The interface 270 may include, for example, an HDMI 272, a USB 274, an optical interface 276, or a D-subminiature (D-sub) 278. The interface 270 may be included, for example, in the communication interface 170 shown in FIG. 1. Additionally or alternatively, the interface 270 may include, for example, a mobile high-definition link (MHL) interface, an SD card/multi-media card (MMC) interface, or an infrared data association (IrDA) standard interface.

The audio module 280 may, for example, convert sound and electrical signals bidirectionally. At least some elements of the audio module 280 may be included, for example, in an input/output interface 145 shown in FIG. 1. The audio module 280 may process sound information input or output through, for example, a speaker 282, a receiver 284, earphones 286, the microphone 288, or the like. According to an embodiment, a camera module 291 may include, for example, at least one image sensor (e.g., front sensor, or rear sensor), a lens, an image signal processor (ISP), or a flash (e.g., LED or xenon lamp, etc.), as a device capable of capturing still images and moving images. The power management module 295 may manage, for example, power of the electronic device 201. According to an embodiment, the power management module 295 may include a power management integrated circuit (PMIC), a charging IC, or a battery or fuel gauge. The PMIC may have a wired and/or wireless charging system. The wireless charging system may include, for example, a magnetic resonance system, a magnetic induction system, or an electromagnetic wave system, and may further include an additional circuit for wireless charging, for example, a coil loop, a resonant circuit, or a rectifier. The battery gauge may measure, for example, a remaining amount of the battery 296, a voltage during charging, a current, or a temperature. The battery 296 may include, for example, a rechargeable battery and/or a solar cell.

An indicator 297 may indicate a particular state of the electronic device 201 or a part thereof (e.g., the processor 210), such as a boot state, a message state, a charge state, and the like. A motor 298 may convert an electrical signal to mechanical vibration, and may generate vibration, haptic effects, and the like. The electronic device 201 may include a mobile TV support device (e.g., a GPU) capable of processing media data according to standards such as digital multimedia broadcasting (DMB), digital video broadcasting (DVB), or mediaFlo™. Each of the elements described in the specification may be composed of one or more components and the name of the element may be changed according to the type of the electronic device. In various embodiments, an electronic device (e.g., the electronic device 201) may have some elements omitted or further include additional elements. Some of the elements may be combined into one entity, but functions of the corresponding components before the combination may be performed in the same manner.

Figure 3:
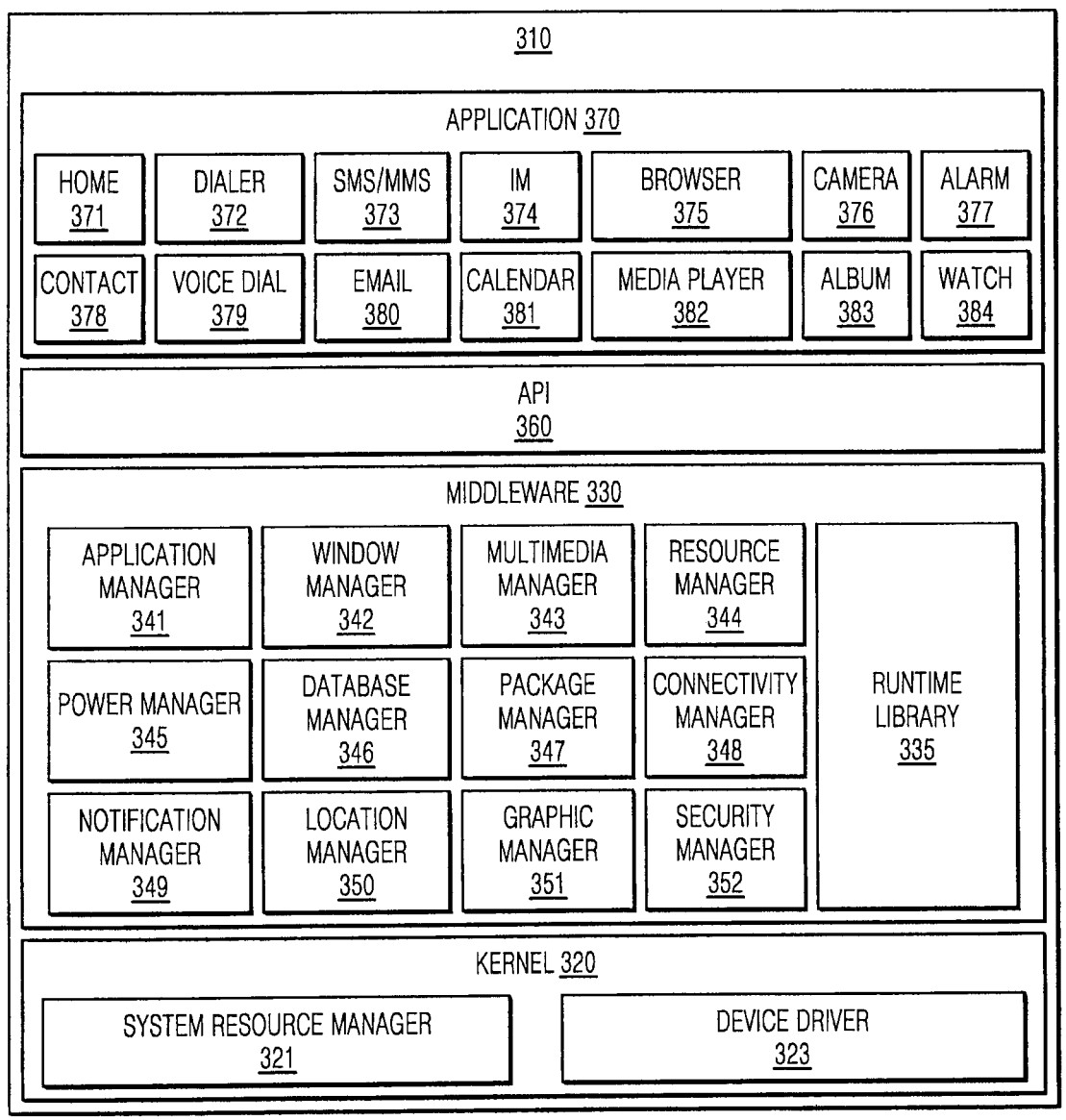
FIG. 3 is a block diagram of a program module according to various embodiments of the present disclosure.

FIG. 3 is a block diagram of a program module according to various embodiments of the present disclosure. According to an embodiment, a program module 310 (e.g., the program 140) may include an operating system that controls resources associated with an electronic device (e.g., the electronic device 101) and/or various applications running on the operating system (e.g., the application program 147). The operating system may include, for example, Android™, iOS™, Windows™, Symbian™, Tizen™, or Bada™. Referring to FIG. 3, the program module 310 may include a kernel 320 (e.g., the kernel 141), middleware 330 (e.g., the middleware 143), an API 360 (e.g., the API 145)), and/or an application 370 (e.g., the application program 147). At least a portion of the program module 310 may be preloaded on the electronic device or downloadable from an external electronic device (e.g., the electronic devices 102 and 104, the server 106, etc.). At least a portion of the program module 310 may be preloaded on the electronic device or downloadable from the external electronic device (e.g., the electronic devices 102 and 104, the server 106, etc.).

The kernel 320 may include, for example, a system resource manager 321 and/or a device driver 323. The system resource manager 321 may perform control, allocation, or recovery of system resources. According to an embodiment, the system resource manager 321 may include a process manager, a memory manager, or a file system manager. The device driver 323 may include, for example, a display driver, a camera driver, a Bluetooth driver, a shared memory driver, a USB driver, a keypad driver, a WiFi driver, an audio driver, or an inter-process communication (IPC) driver. Middleware 330 may provide an application 370, for example, with functions that are commonly needed by the application 370 or various functions through an API 360 such that the application 370 may use limited system resources inside the electronic device. According to an embodiment, the middleware 330 may include at least one of a runtime library 335, an application manager 341, a window manager 342, a multimedia manager 343, a resource manager 344, a power manager 345, a database manager 346, a package manager 347, a connectivity manager 348, a notification manager 349, a location manager 350, a graphic manager 351, a security manager 352, and the like.

The runtime library 335 may include, for example, a library module used by a compiler to add new functions via a programming language while the application 370 is executing. The runtime library 335 may perform input/output management, memory management, or arithmetic function processing. The application manager 341 may manage, for example, a life cycle of the application 370. The window manager 342 may manage GUI resources used in a screen. The multimedia manager 343 may identify a format required for reproduction of the media files and perform encoding or decoding of the media files using a codec suitable for the format. The resource manager 344 may manage a source code of the application 370 or the space of a memory. The power manager 345 may, for example, manage the capacity or power of a battery and provide power information necessary for the operation of an electronic device. According to an embodiment, the power manager 345 may be interlocked with a basic input/output system (BIOS). The database manager 346 may create, retrieve, or modify, for example, a database to be used in the application 370. The package manager 347 may manage installation or update of an application distributed in the form of a package file.

The connectivity manager 348 may, for example, manage wireless connection. The notification manager 349 may provide a user with an event such as an arrival message, an appointment, a proximity notification, and the like. The location manager 350 may manage, for example, location information of an electronic device. The graphic manager 351 may manage, for example, a graphical effect to be provided to a user or a user interface related thereto. The security manager 352 may provide, for example, system security or user authentication. According to an embodiment, the middleware 330 may include a telephony manager for managing a voice or video call function of an electronic device or middleware module capable of forming a combination of functions of the aforementioned elements. According to an embodiment, the middleware 330 may provide a module specialized for each type of an operating system. The middleware 330 may dynamically delete some of the elements or add new elements. The API 360 may be provided in a different configuration depending on an operating system, for example, as a set of API programming functions. For example, for Android or iOS, one API set may be provided for each platform, and for Tizen, two or more API sets may be provided for each platform.

The application 370 may include home 371, a dialer 372, short message service (SMS)/multimedia message service (MMS) 373, an instant message (IM) 374, a browser 375, a camera 376, an alarm 377, contacts 378, voice dial 379, email 380, a calendar 381, a media player 382, an album 383, a watch 384, healthcare (e.g., measuring exercise or blood glucose), or an application that provides environmental information (e.g., air pressure, humidity, or temperature information). According to an embodiment, the application 370 may include an information exchange application that may support exchange of information between an electronic device and an external electronic device. The information exchange application may include, for example, a notification relay application for communicating specific information to an external electronic device, or a device management application for managing an external electronic device. For example, a notification delivery application may transmit notification information generated in another application of an electronic device to an external electronic device, or may receive notification information from an external electronic device and provide the notification information to a user. The device management application may include, for example, a function of an external electronic device in communication with an electronic device (e.g., turning on/off the external electronic device (or some components) or adjusting brightness (or resolution) of a display), or may install, delete, or update an application operating in the external electronic device. According to an embodiment, the application 370 may include an application (e.g., a healthcare application of a mobile medical device) designated according to the attributes of an external electronic device. According to an embodiment, the application 370 may include an application received from an external electronic device. At least some of the program module 310 may be implemented (e.g., executed) in software, firmware, hardware (e.g., the processor 210), or a combination of at least two of them, and may include modules, programs, routines, instruction sets, or processes for performing one or more functions . . . .

The term "module" as used herein encompasses units comprised of hardware, software, or firmware and may be used interchangeably with terms such as logic, logic blocks, components, or circuits. The "module" may be an integrally constructed component or a minimum unit or part thereof that performs one or more functions. The "module" may be implemented either mechanically or electronically and may include, for example, application-specific integrated circuit (ASIC) chips, field-programmable gate arrays (FPGAs), or programmable logic devices that are known or to be developed in the future and perform certain operations. At least some of the devices (e.g., modules or functions thereof) or methods (e.g., operations) according to various embodiments may be implemented with an instruction stored in a computer-readable storage medium (e.g., the memory 130)

in the form of a program module. When the instruction is executed by a processor (e.g., the processor 120), the processor may perform a function corresponding to the instruction. The computer-readable recording medium may be a hard disk, a floppy disk, a magnetic medium such as a magnetic tape, an optical recording medium such as a CD-ROM, a DVD, a magnetic-optical medium such as a floptical disk, internal memory, or the like. The instruction may include code generated by a compiler or code that may be executed by an interpreter. Modules or program modules according to various embodiments may include one or more of the elements described above, some of which may be omitted, or may further include other elements. Operations performed by modules, program modules, or other elements, according to various embodiments, may be performed sequentially, in parallel, repetitively, or heuristically, or at least some of the operations may be performed in a different order, omitted, or other operations may be added. Hereinafter, the first and second electronic devices 101 and 201 connected to respective connectors in the interface 270, for example, a USB 3.1 type, and a method of controlling the corresponding interface 270 will be described. The electronic device 201 that supports a USB interface described in the various embodiments employs the USB 3.1 type and describes a C type connector that is a terminal type that can be inserted in various directions. However, the various embodiments are not limited thereto.

Figure 4A:
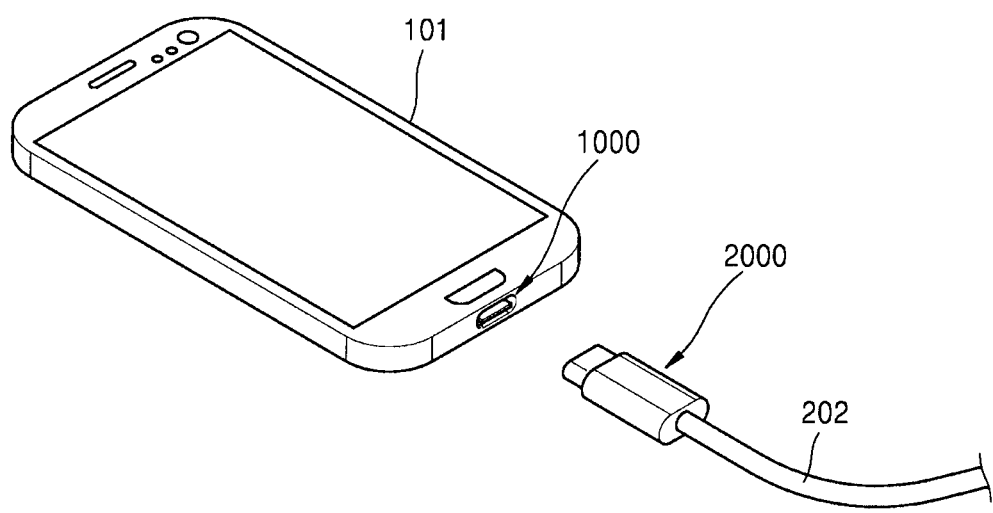
FIG. 4A is a perspective view of an electronic device supporting a USB interface according to various embodiments of the present disclosure.
Figure 4B:
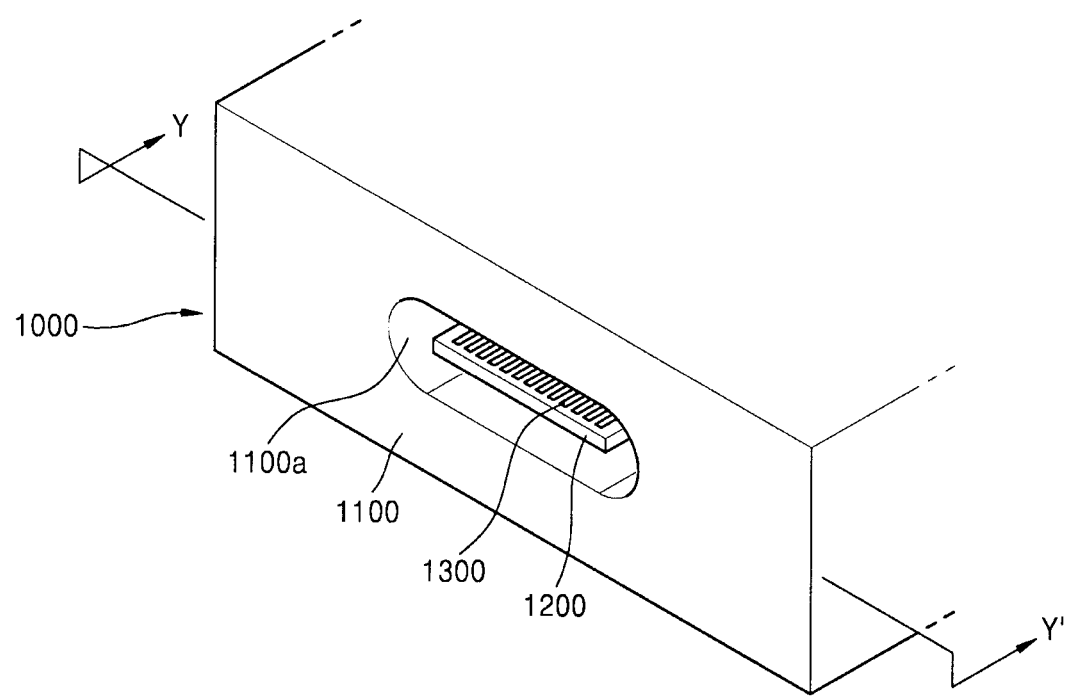
FIG. 4B is a front view of a receptacle according to various embodiments of the present disclosure.
Figure 4C:
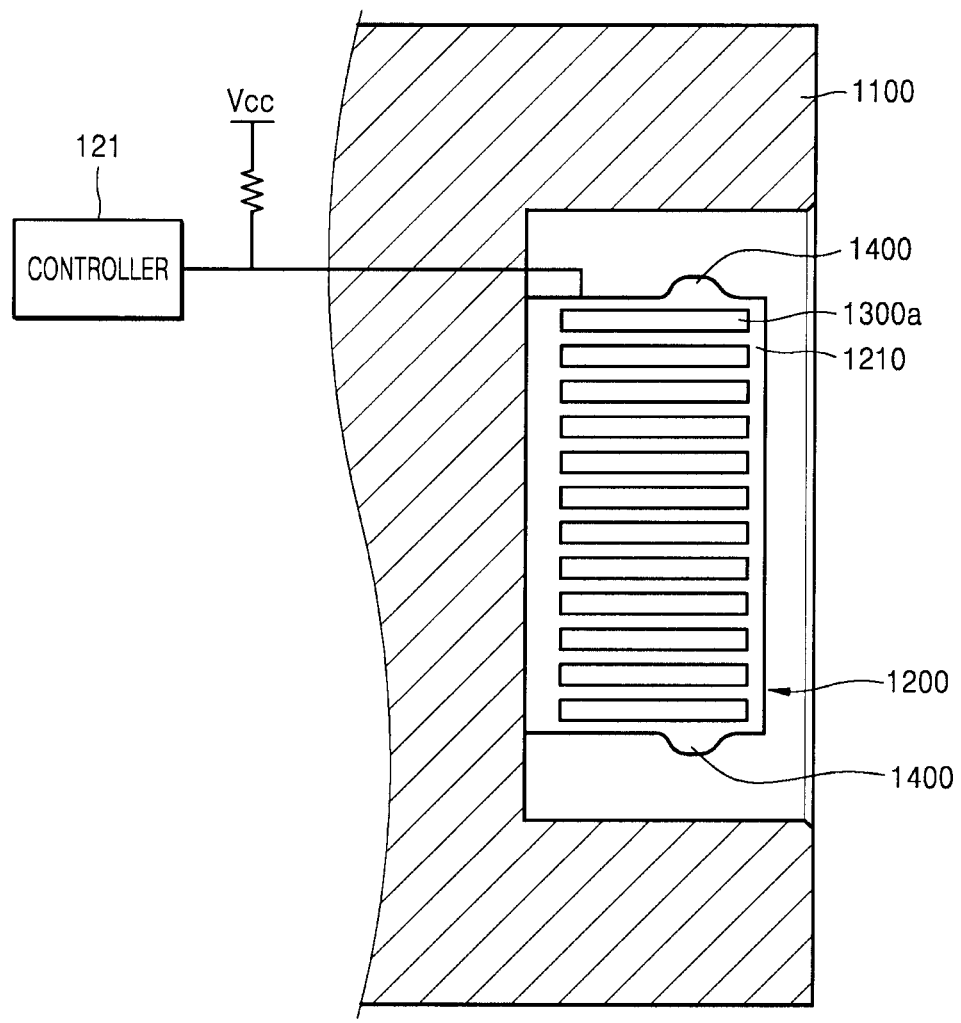
FIG. 4C is a cross-sectional view of an external connector shown in FIG. 4B taken along a line Y-Y'.

FIG. 4A is a perspective view of an electronic device supporting a USB interface according to various embodiments of the present disclosure. FIG. 4B is a front view of a receptacle according to various embodiments of the present disclosure. FIG. 4C is a cross-sectional view of a receptacle shown in FIG. 4B taken along a line Y-Y'.

Referring to FIGS. 4A to 4C, a receptacle 1000 and an external connector 2000 may be connected to an electronic device, respectively. Here, the electronic device 101 connected to the receptacle 1000 may be, for example, a terminal, and the external connector 2000 may be connected to another external device through a cable 202. The external connector 2000 may be arranged to be inserted into the receptacle 1000 to interconnect the electronic device 101 connected to the receptacle 1000 to the external connector 2000.

The receptacle 1000 according to the present disclosure may include a housing 1100, a pin mounting portion 1200 in the housing 1100, a plurality of receptacle pins 1300 in a plurality of grooves (not shown) formed in the pin mounting portion 1200, and a first fastener 1400 on both sides of the housing 1100.

According to various embodiments, the housing 1100 may include an opening 1100a with a front entrance for connection with the external connector 2000. As an example, at least a portion of the pin mounting portion 1200 may be arranged inside the opening 1100a of the housing 1100. Therefore, the pin mounting portion of the external connector 2000 may be inserted into the opening 1100a of the housing 1100 and may contact the pin mounting portion 1200 of the receptacle 1000.

The pin mounting portion 1200 may include a plurality of grooves with the plurality of receptacle pins 1300. As an example, the pin mounting portion 1200 may include a first surface 1210 and a second surface 1220 opposite to each other, and may further include a plurality of grooves arranged on the first and second surfaces 1210 and 122 of the pin mounting portion 1200. Here, the number of grooves may be twelve. However, the various embodiments are not limited thereto, and the number of grooves may vary according to the number of receptacle pins 1300 to be seated. Here, the pins may be arranged in all of the plurality of grooves, or the pins may be arranged in only a few of the plurality of grooves. In other words, the number of pins may be determined depending on the use of the receptacle 1000. For example, when a cable having the receptacle 1000 is limited only for data communication, it is not necessary that the pins are arranged in all of the plurality of grooves, and it is sufficient that the pins are arranged only in the corresponding grooves.

The plurality of receptacle pins 1300 have elasticity and may be arranged such that portions thereof protrude outward from the plurality of grooves. When the pin mounting portion of the external connector 2000 is inserted into the housing 1100, it is brought into close contact with the external connector pin. The first fastener 1400 is a fastening device for tightly fitting the receptacle 1000 into the external connector 2000. As an example, the first fastener 1400 may be on both sides of the pin mounting portion 1200 and a portion of the first fastener 1400 may be arranged to protrude from both sides of the pin mounting portion 1200 and may contact a portion of the external connector 2000. However, the various embodiments are not limited thereto. The first fastener 1400 may be on one side or any one of upper and lower sides of the pin mounting portion 1200 and may contact a portion of the external connector 2000 so that the receptacle 1000 and the external connector 2000 may be fastened together.

Figure 5A:
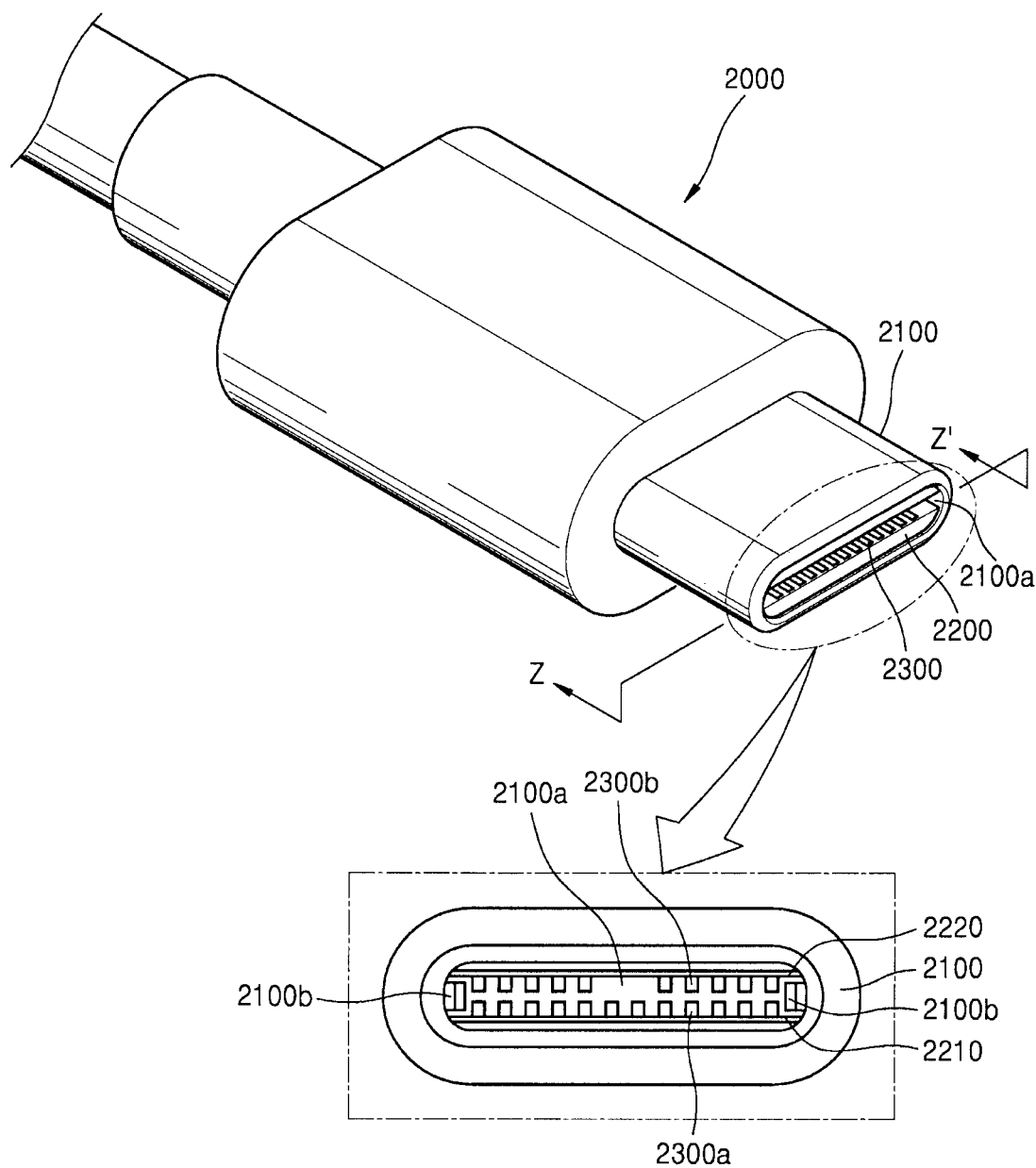
FIG. 5A is a front view of an external connector according to various embodiments of the present disclosure.
Figure 5B:
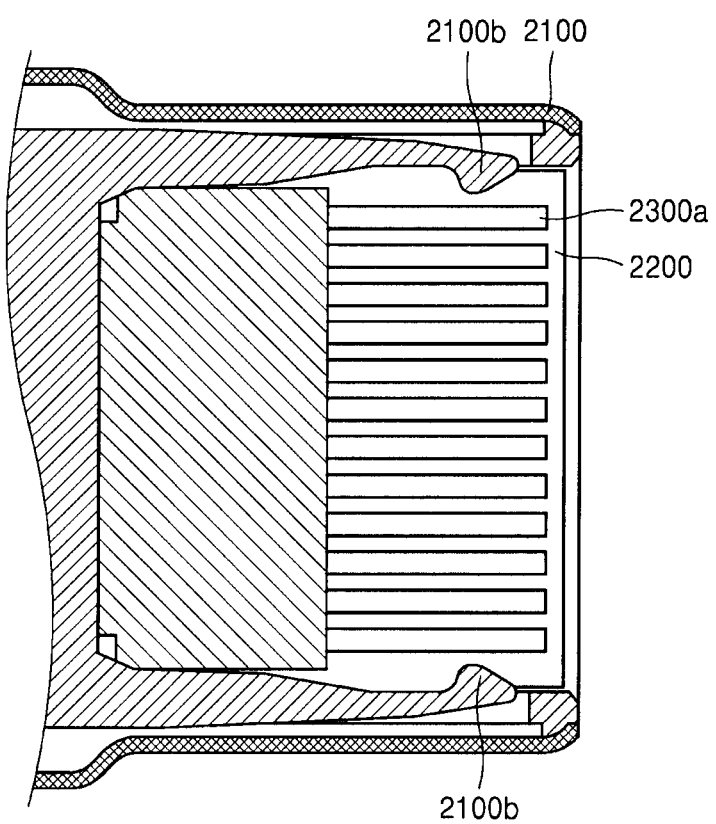
FIG. 5B is a cross-sectional view of the external connector shown in FIG. 5A taken along a line Z-Z'.

FIG. 5A is a perspective view of an external connector according to various embodiments of the present disclosure. FIG. 5B is a cross-sectional view of the external connector shown in FIG. 5A taken along a line Z-Z'.

Referring to FIG. 4A and FIGS. 5A and 5B, the external connector 2000 according to various embodiments may include a housing 2100, a pin mounting portion 2200 in the housing 2100, and a plurality of receptacle pins 2300 in a plurality of grooves (not shown) formed in the pin mounting portion 2200.

In the above-described configuration, the housing 2100 may include an opening 2100a with a front entrance so that the housing 2100 of the external connector 2000 may be inserted into the housing 1100 of the receptacle 1000. A second fastener 2100b fitted to the first fastener 1400 of the receptacle 1000 may be on both sides of the inside of the housing 2100. As an example, the second fastener 2100b may be implemented as a latch structure in which the first fastener 1400 can be fitted, but various embodiments are not limited thereto. The receptacle 1000 may be tightly fastened to the external connector 2000 unless the receptacle 1000 is pulled out as the second fastener 2100b and the first fastener 1400 are fastened together.

The pin mounting portion 2200 forms a plurality of grooves in which a plurality of external connector pins 2300 are arranged, and the number of grooves is the same as the number of grooves of the receptacle 1000. The pins may be arranged in all of the plurality of grooves or in only a few of the plurality of grooves. In the USB 3.1 type according to an example, an external device connected by the receptacle 1000 and the external connector 2000 may operate as a USB host or as a USB device. Therefore, the external connector pins 2300 may be arranged in all of the plurality of grooves so as to expand an interface.

The plurality of external connector pins 2300 are arranged in the pin mounting portion 2200 so that when the housing 2100 of the external connector 2000 is fitted into the housing 1100 of the receptacle 1000, the plurality of external connector pins 2300 contact the plurality of receptacle pins 1300 of the receptacle 1300.

Figure 6A:
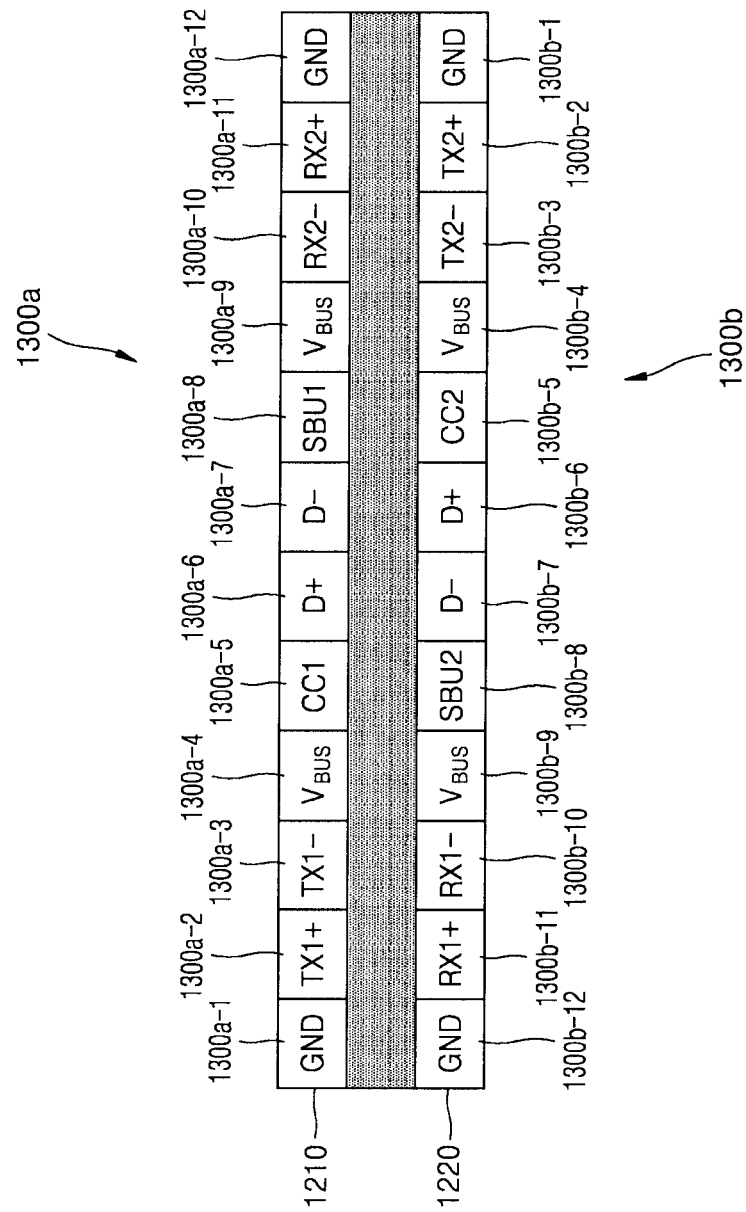
FIG. 6A is a schematic view for describing a function of a receptacle pin according to various embodiments of the present disclosure.
Figure 6B:
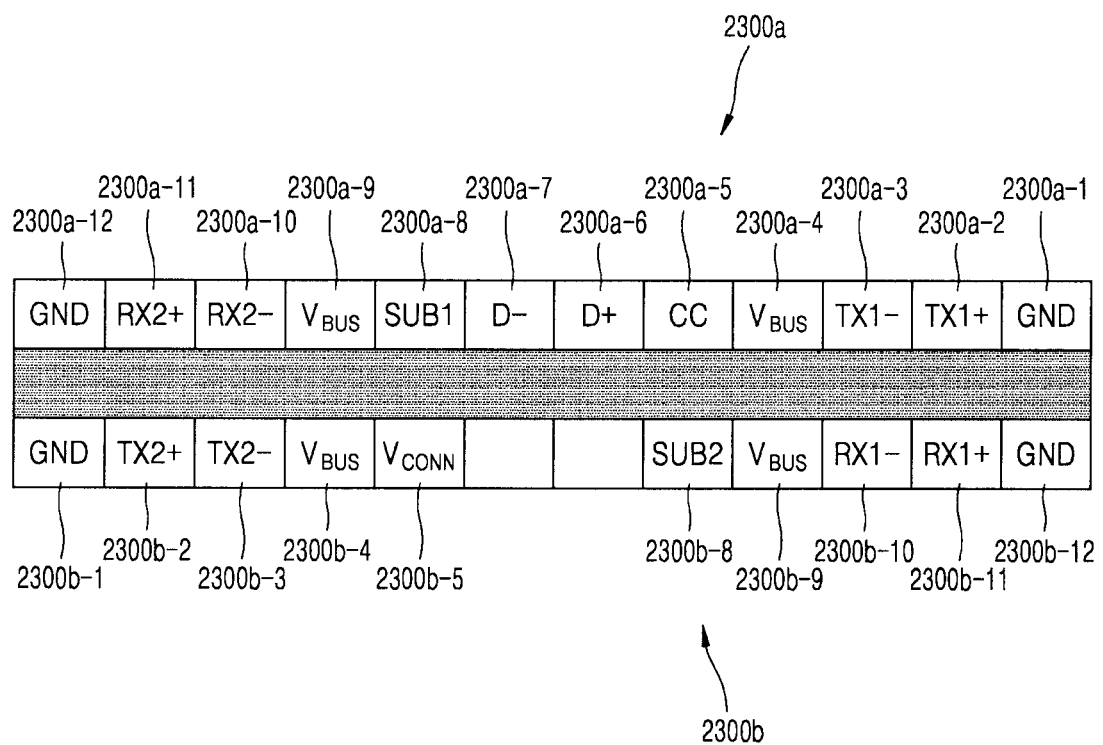
FIG. 6B is a schematic view for describing a function of a second external connector pin according to various embodiments of the present disclosure.

Table 1 below is a table illustrating functions of pins according to various embodiments shown in FIGS. 6A and 6B. As an example, the plurality of receptacle pins 1300 may include a first receptacle pin 1300a on the first surface 1210 of the pin mounting portion 1200 and a second receptacle pin 1300b on the second surface 1220 of the pin mounting portion 1200. As described above, the first and second receptacle pins 1300a and 1300b may be arranged to correspond to a plurality of grooves included in the pin mounting portion 1200 so as to be symmetrical with respect to a central portion of the pin mounting portion 1200.

As an example, when the plurality of receptacle pins 1300 include the first and second receptacle pins 1300a and 1300b on the first and second surfaces 1210 and 1220 of the pin mounting portion 1200, a plurality of external connector pins 2300 may include a first external connector pin 2300a and a second external connector pin 2300b arranged to face each other at the first and second pin mounting portions 2210 and 2220, and the first and second external connector pins 2300a and 2300b may correspond to the first and second receptacle pins 1300a and 1300b, respectively.

As shown in Table 1, each of the number of first and second receptacle pins 1300a and 1300b and the number of first and second external connector pins 2300a and 2300b according to various embodiments may be twelve, and some or all of the pins are arranged in the receptacle 1000 and the external connector 2000 described above. In Table 1 below, Pin No. indicates the position of a pin in a connector. That is, a pin having the pin number 1 is located in a groove formed on the rightmost side of the pin mounting portions 1200 and 2200 of the receptacle 1000 and the external connector 2000, and the pin having the pin number 12 is located in a groove formed in the leftmost side.

TABLE 1

| PIN No. | Signal Name | Remarks |
| --- | --- | --- |
| 1 | GND | Ground |
| 2 | TX+ | Super speed TX positive |
| 3 | TX− | Super speed TX negative |
| 4 | $V_{bus}$ | USB cable charging power |
| 5 | CC | identification terminal |
| 6 | D+ | + line of the differential bi-directional USB signal |
| 7 | D− | − line of the differential bi-directional USB signal |
| 8 | SBU | Side Band Use: additional purpose pin (ex: Audio signal, display signal, etc.) |
| 9 | $V_{bus}$ | USB cable charging power |
| 10 | RX− | Super speed RX negative |
| 11 | RX+ | Super speed TX positive |
| 12 | GND | Ground |

As described above, the receptacle 1000 and the external connector 2000 employing the USB 3.1 type according to various embodiments may support both a USB host and a USB device. As an example, an electronic device supporting a USB interface may measure a voltage of an identification terminal USB_ID, for example, a voltage of second external connector pin No. 5 CC, and may define an insertion direction of the external connector 2000 connected to the receptacle 1000 and whether an external device connected to the receptacle 1000 and the external connector 2000 operates as a USB device or as a USB host.

As described above, the electronic device measures the voltage of the identification terminal USB_ID, for example, the voltage of second external connector pin No. 5 CC to recognize the insertion direction of the external connector 2000. Also, a predetermined current needs always to be applied to the identification terminal USB_ID in order to define whether the external device connected to the receptacle 1000 and the external connector 2000 is a USB device or a USB host. Here, the identification terminal USB_ID exposed to the outside may be corroded by external moisture, and the use of unnecessary current may be increased.

Figure 7:
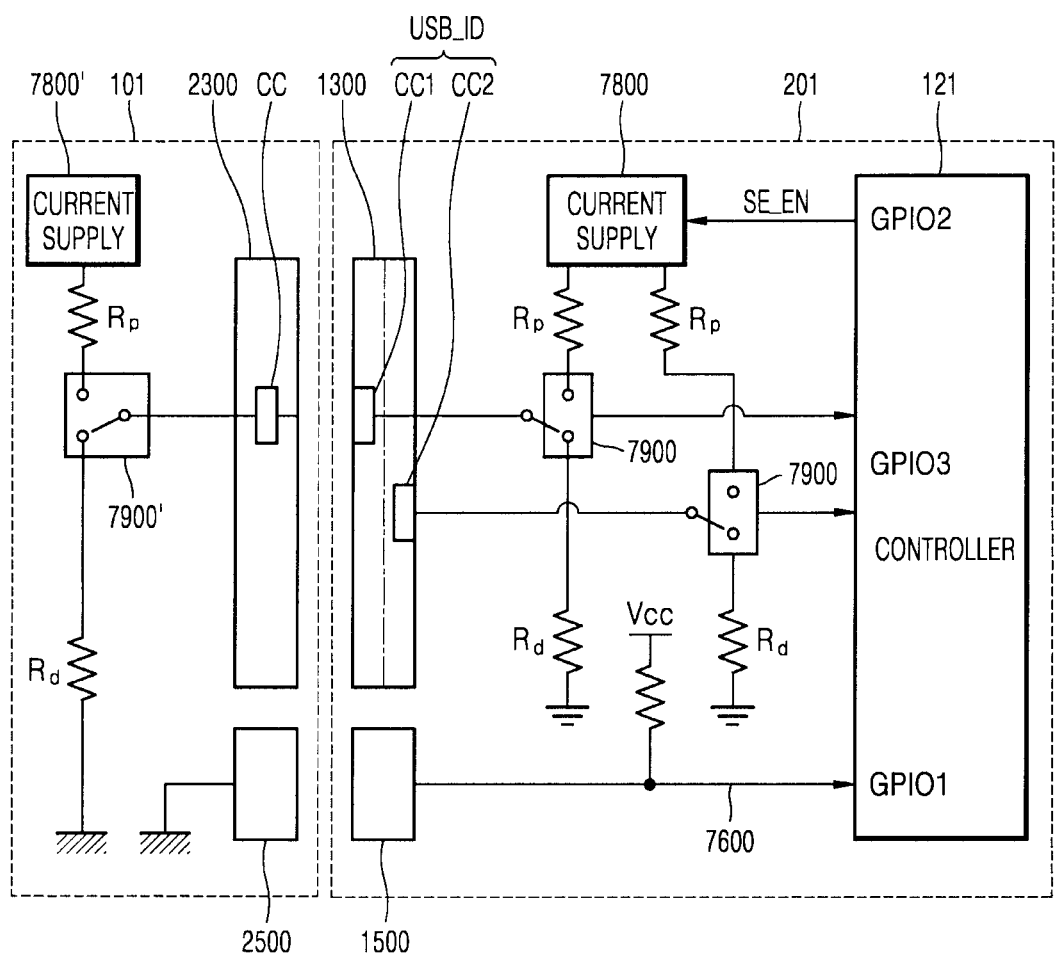
FIG. 7 is a circuit diagram of an electronic device supporting a USB interface according to various embodiments of the present disclosure.
Figure 8:
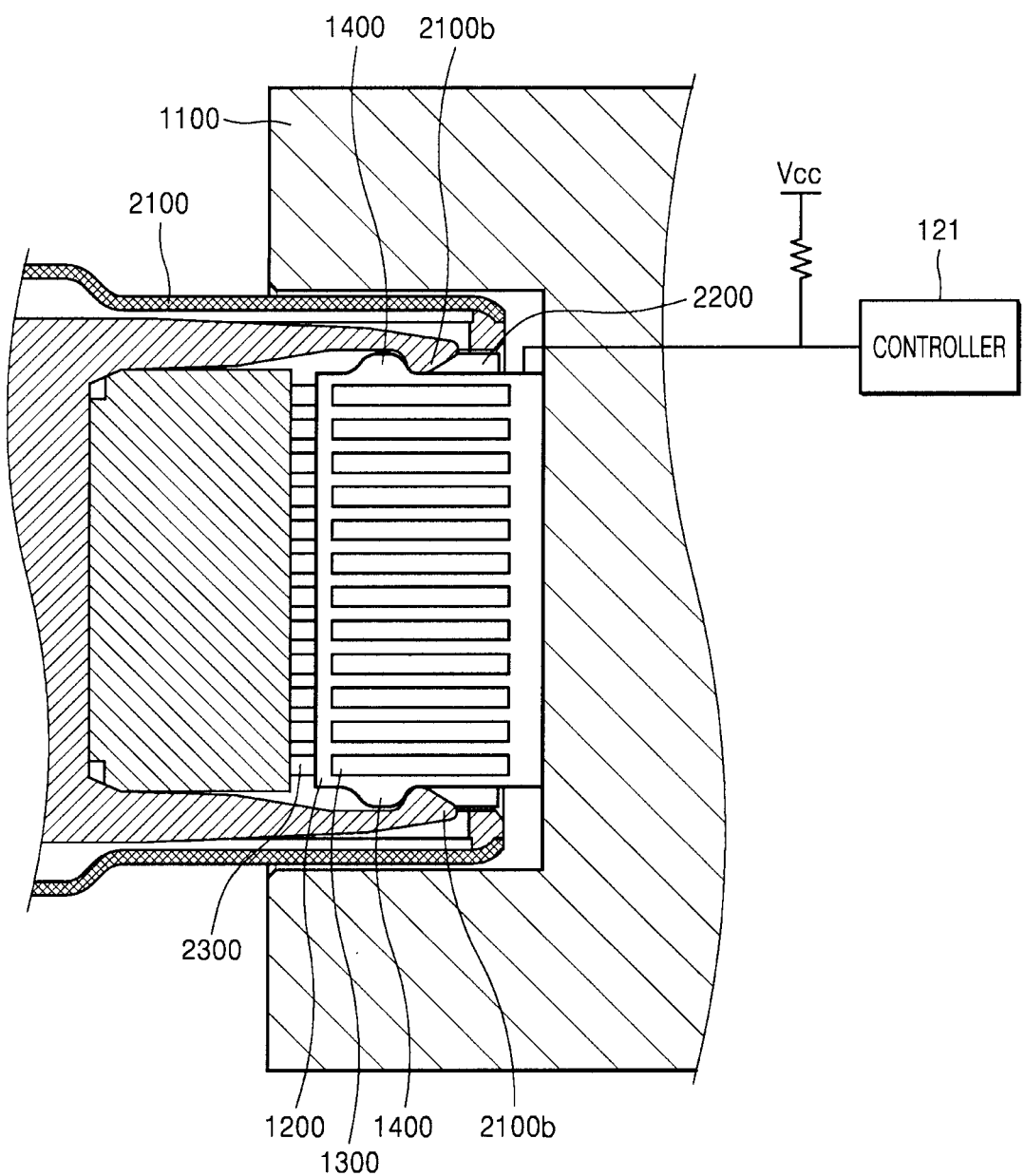
FIG. 8 is a cross-sectional view illustrating a connection state of a receptacle and an external connector according to various embodiments of the present disclosure.

FIG. 7 is a control circuit of an electronic device supporting a USB interface according to various embodiments of the present disclosure. FIG. 8 is a cross-sectional view illustrating a connection state of a receptacle and an external connector according to various embodiments of the present disclosure.

Referring to FIGS. 7 and 8, the receptacle 1000 and the external connector 2000 may respectively include a connection sensor 1500 and a connector 2500 that can be in contact with each other when the external connector 2000 is inserted into the receptacle 1000. The connection sensor 1500 may be connected to a USB device detection line 7600 to maintain a voltage level at high level Vcc. The connector 2500 may be connected to ground immediately after being separated from a ground pin GND provided on the external connector pin 2300 so as to be electrically separated from the plurality of external connector pins 2300 shown in FIG. 5B. According to various embodiments, when the connection sensor 1500 included in the receptacle 1000 and the connector 2500 included in the external connector 2000 are in contact with each other, an output signal of the USB device detection line 7600 connected to the connection sensor 1500, for example, the voltage level, may be converted from the high level Vcc to a low level Ground.

A controller 121 may apply a control signal SE_EN to a current supply 7800 according to a voltage level detected from the USB device detection line 7600. According to various embodiments, the controller 121 may control the current supply 7800 provided by the controller 121. The current supply 7800 may apply a predetermined current to the identification terminal USB_ID, for example, first and second receptacle pins No. 5 CC1 and CC2 according to the control signal SE_EN provided from the controller 121. The current supply 7800 is activated by the controller 121 and when the current supply 7800 applies a predetermined current to the identification terminal USB_ID, for example, the first and second receptacle pins No. 5 CC1 and CC2, one of the first and second receptacle pins No. 5 CC1 and CC2 may be connected to the external connector pin No. 5 CC. Accordingly, any one of the first and second receptacle pins No. 5 CC1 and CC2 may be kept exposed and a predetermined voltage may be measured from the other receptacle pin No. 5.

According to various embodiments, when the electronic devices 101 and 102 connected to the receptacle 1000 and the external connector 2000 are connected to each other via a USB interface, the electronic devices 101 and 102 may be divided into a host (e.g., downstream facing port (DFP)) and a device (or a slave) (e.g., upstream facing port (UFP)), which may be designated through the identification terminal USB_ID (e.g., CC1 or CC2) of the USB interface. For example, in an electronic device using a USB interface, a connection method may be divided into a host (e.g., DFP) and a device (or a slave) (e.g., UFP) by pull-up Rp or current sourcing and pull-down Rd. As an example, among the electronic devices 101 and 102 connected to the receptacle 1000 and the external connector 2000, a device having the pull-down Rd is defined as a device, and the host DFP may supply power through a power supply pin (e.g., VBUS or VCONN) as required by the device UFP.

Also, the electronic devices 101 and 102 connected to the receptacle 1000 and the external connector 2000 may operate as a dual role port (DRP) in addition to the host and the device. The DRP may represent a mode (function) capable of adaptively changing the role of a host or device of an electronic device. For example, when the DRP is connected to a host, the DRP may be changed to a device, and when the DRP is connected to a device, the DRP may be changed to a host. Also, when two DRPs are connected together, for example, one DRP operates as a host, and the other DRP operates as a device, randomly between a host and a device. For example, an electronic device such as a smart phone or a PC may serve both as a host and as a device.

As various embodiments, as shown in FIG. 7, when the electronic devices 101 and 102 connected to the receptacle 1000 and the external connector 2000 operate as DRPs, the current supply 7800 may be activated by the controller 121. Therefore, when the current supply 7800 applies a predetermined current to the identification terminal USB_ID, for example, the first and second receptacle pins No. 5 CC1 and CC2, a voltage level of the first and second receptacle pins No. 5 CC1 and CC2 may be toggled periodically between pull-up H and pull-down L by a switch 7900 between the first and second receptacle pins No. 5 CC1 and CC2 and the current supply 7800. Here, the external connector pin No. 5 CC may also be toggled periodically between the pull-up H and the pull-down L by a switch 7900' between the pin No. 5 CC and a current supply 7800'.

Accordingly, when the external connector pin No. 5 CC is connected to any one of the first and second receptacle pins No. 5 CC1 and CC2, it is possible to define whether an external device connected to the receptacle 1000 and the external connector 2000 operates as a USB host or as a USB device by using a voltage level for the external connector pin No. 5 CC and a voltage level for the first and second receptacle pins No. 5 CC1 and CC2 connected to the external connector pin No. 5 CC. Therefore, a role of the external device connected to the receptacle 1000 and the external connector 2000 according to the definition by the external connector pin No. 5 CC and the first and second receptacle pins No. 5 CC1 and CC2 may be defined. Also, the electronic devices 101 and 201 connected to the receptacle 1000 and the external connector 2000 may operate as a USB host or a USB device.

Figure 9A:
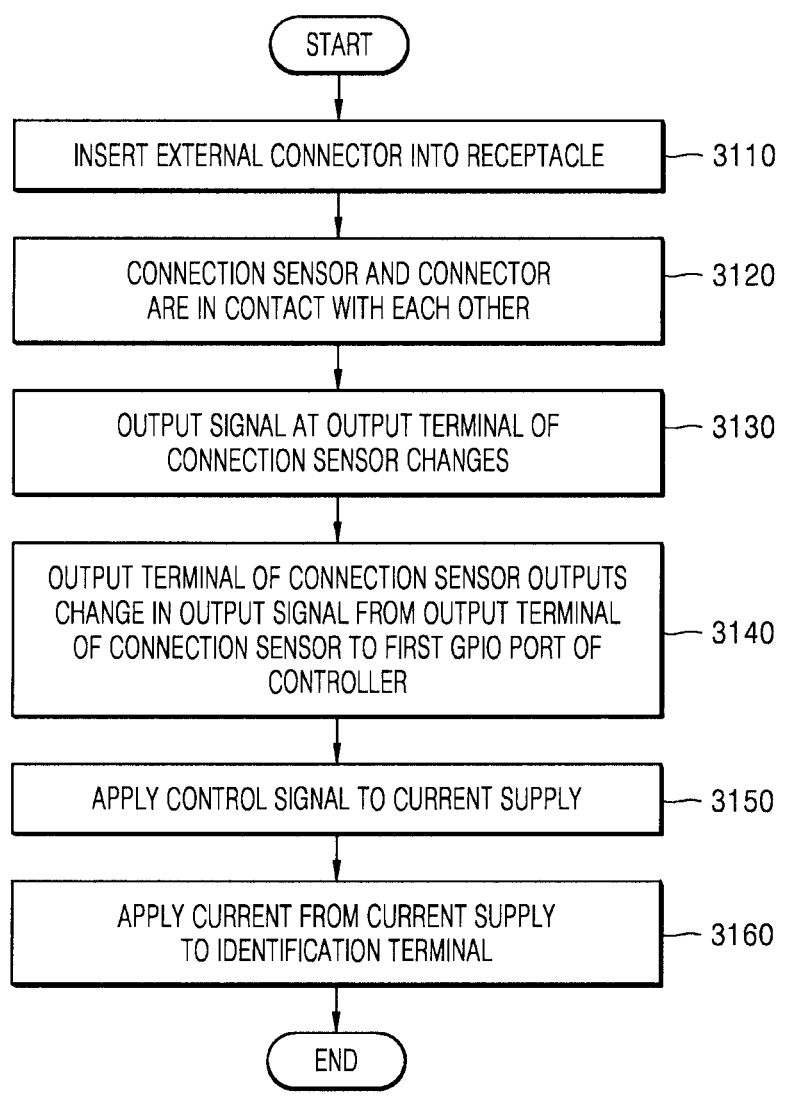
FIG. 9A is a flowchart of a method of controlling an electronic device supporting a USB interface operating according to various embodiments of the present disclosure.

FIGS. 9A and 9B are flowcharts of a method of controlling an electronic device supporting a USB interface according to various embodiments of the present disclosure.

Referring to FIG. 9A, in operation 3110, the external connector 2000 may be inserted into the receptacle 1000.

In operation 3120, the connection sensor 1500 included in the receptacle 1000 and the connector 2500 included in the external connector 2000 may be in contact with each other. The connection sensor 1500 according to various embodiments may be the first fastener 1400 in the form of a latch on both sides of the pin mounting portion 1200 shown in FIG. 4B. The connector 2500 may be the second fastener 2100b of the external connector 2000 shown in FIG. 5B, which is fastened to the first fastener 1400 in the form of a latch. However, the various embodiments are not limited thereto, and the connection sensor 1500 may be in only a portion of the first fastener 1400 on both sides of the pin mounting portion 1200.

Here, the first fastener 1400 may be connected to the USB device detection line 7600 to maintain a voltage level at high level Vcc. The second fastener 2100b may be connected to ground immediately after being separated from a ground pin GND provided on the external connector pin 2300 so as to be electrically separated from the plurality of external connector pins 2300 shown in FIG. 5B. When the external connector 2000 is inserted into the receptacle 1000, the first and second fasteners 1400 and 2100b may be in contact with each other as shown in FIG. 8.

In operation 3130, an output signal at an output terminal of the connection sensor 1500 may change. According to various embodiments, when the connection sensor 1500 included in the receptacle 1000 and the connector 2500 included in the external connector 2000 are in contact with each other, an output signal of the USB device detection line 7600 connected to the connection sensor 1500, for example, the first fastener 1400, may be converted from the high level Vcc to the low level Ground.

In operation 3140, the output terminal of the connection sensor 1500 may output a change in an output signal, for example, a voltage level, to a first GPIO port GPIO1. According to various embodiments, when a voltage level of the USB device detection line 7600 is converted from the high level Vcc to the low level Ground in the output terminal of the connection sensor 1500, the control circuit may recognize that the external connector 2000 is connected to the receptacle 1000.

In operation 3150, the controller 121 may apply the control signal SE_EN to the current supply 7800 according to a voltage level detected from the USB device detection line 7600. According to various embodiments, it is possible to control whether or not the current supply 7800 for applying a predetermined current to the identification terminal USB_ID, for example, the first and second receptacle pins No. 5 CC1 and CC2, is activated by the control signal SE_EN provided by the controller 121.

In operation 3160, a predetermined current may be applied from the current supply 7800 to the identification terminal USB_ID. According to various embodiments, only when the external connector 2000 is inserted into the receptacle 1000 by the current supply 7800, a predetermined current is applied from the current supply 7800 to the identification terminal USB_ID so that corrosion of the identification terminal USB_ID exposed to the outside and the use of unnecessary current may be prevented.

Referring to FIG. 9B, in a method of controlling an electronic device supporting a USB interface according to various embodiments, after a predetermined current is applied from the current supply 7800 to the identification terminal USB_ID in operation 3160, in operation 3170, the insertion direction of an external connector may be determined. The current supply 7800 is activated by the controller 121 according to various embodiments and when the current supply 7800 applies a predetermined current to the identification terminal USB_ID, for example, the first and second receptacle pins No. 5 CC1 and CC2, one of the first and second receptacle pins No. 5 CC1 and CC2 may be connected to the external connector pin No. 5 CC. Accordingly, any one of the first and second receptacle pins No. 5 CC1 and CC2 may be kept exposed and an insertion direction of the external connector 2000 may be determined as a predetermined voltage is measured from the other receptacle pin No. 5.

In operation 3180, a role of an external connector and an external device connected to a receptacle may be defined. When the electronic devices 101 and 102 connected to the receptacle 1000 and the external connector 2000 according to various embodiments are connected to each other via a USB interface, the electronic devices 101 and 102 may be divided into a host and a device or may operate as a DRP. The definition of a role of the electronic devices 101 and 102 connected to the receptacle 1000 and the external connector 2000 may be specified through the identification terminal USB_ID (e.g., CC1 or CC2) of the USB interface. Since the matters related to the electronic devices 101 and 102 connected to the receptacle 1000 and the external connector 2000 are substantially the same as those described in FIGS. 7 and 8, the description thereof will be omitted here for convenience of explanation.

According to various embodiments, an electronic device supporting a USB interface may include: a housing; an opening provided in a part of the housing; a receptacle, which is arranged in at least a part of the inside of the opening, including a first surface and a second surface that are parallel to each other, and a plurality of first receptacle pins and a plurality of second receptacle pins respectively arranged on the first surface and the second surface, wherein the plurality of first receptacle pins and the plurality of second receptacle pins are symmetrically arranged with respect to a center portion of the receptacle; and a control circuit, which is electrically connected to at least one of the plurality of first receptacle pins and the plurality of second receptacle pins, configured to sense whether an external connector including first external connector pins and second external connector pins symmetrical to each other is inserted into the receptacle, to apply a predetermined current to any one of the plurality of first receptacle pins and the plurality of second receptacle pins when sensing that the external connector has been inserted into the receptacle, to monitor the predetermined current, and to sense a connection between the first external connector pin and one of the first receptacle pins and the plurality of second receptacle pins according to the monitored predetermined current.

According to various embodiments, the USB interface may be of a C type.

According to various embodiments, at least one of the plurality of first receptacle pins and the plurality of second receptacle pins may have an identification terminal.

According to various embodiments, each of the plurality of first receptacle pins and the plurality of second receptacle pins may include twelve receptacle pins, and the identification terminal may be arranged at the fifth position from any one of opposite end portions of the plurality of first receptacle pins and the plurality of second receptacle pins.

According to various embodiments, an electronic device supporting a USB interface may include: a receptacle including an identification terminal for inserting an external connector into which an external connector to which an external device is connected is inserted, and including an identification terminal for identifying the external device; a connection sensor configured to sense the insertion of the external connector to the receptacle; and a control circuit configured to control a current supplied to the identification terminal depending on whether the external connector is inserted or not.

According to various embodiments, the connection sensor may sense the insertion of the external connector to the receptacle by contact between the receptacle and the external connector.

According to various embodiments, the electronic device may further include a first fastener fastened to a second fastener provided on the external connector and fixing the external connector to the receptacle, wherein a predetermined voltage may be applied to the first fastener, and the connection sensor may sense the insertion of the external connector to the receptacle according to a voltage change of the first fastener generated when the first fastener and the second fastener are in contact with each other.

According to various embodiments, the electronic device may further include an external terminal unit separated from a ground pin provided in the receptacle, wherein a predetermined voltage may be applied to the external terminal unit and the connection sensor may sense the insertion of the external connector to the receptacle according to a voltage change of the external terminal unit generated when the external terminal unit and a portion of the receptacle are in contact with each other.

According to various embodiments, the receptacle may include a housing with a front entrance, and the external terminal unit may be provided in the housing.

According to various embodiments, the external terminal unit may be a dual inline package (DIP) terminal unit.

According to various embodiments, the electronic device may further include a connection sensor configured to sense the insertion of the external connector to the receptacle in a non-contact manner.

According to various embodiments, the connection sensor may be a capacitance sensor.

According to various embodiments, the capacitance sensor may include at least one electrode for which a predetermined capacitance is measured, and the connection sensor may sense the insertion of the external connector to the receptacle according to a change in the capacitance change generated when the external connector is close to the receptacle.

Figure 10:
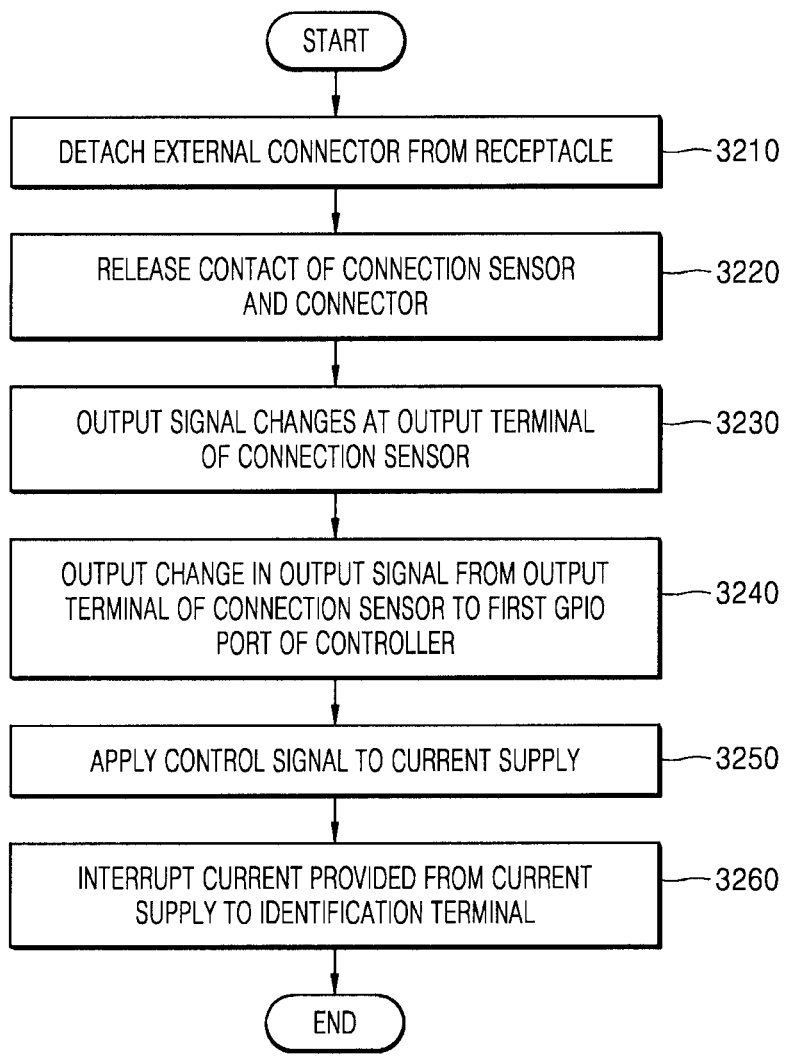
FIG. 10 is a flowchart of a method of controlling an electronic device supporting a USB interface operating according to various embodiments of the present disclosure.

FIG. 10 is a flowchart of a method of controlling an electronic device supporting a USB interface operating according to various embodiments of the present disclosure. Since the configuration included in the present embodiment is substantially the same as that provided in the above-described embodiment, the description thereof will be omitted here for convenience of explanation.

Referring to FIGS. 7, 8, and 10, in operation 3210, the external connector 2000 may be detached from the receptacle 1000.

In operation 3220, the contact of the connection sensor 1500 and the connector 2500 may be released. When the external connector 2000 is detached from the receptacle 1000 according to various embodiments, the contact of the connection sensor 1500 included in the receptacle 1000 and the connector 2500 included in the external connector 2000 may be released.

In operation 3230, an output signal may change at an output terminal of the connection sensor 1500. The connection sensor 1500 according to various embodiments may be connected to the USB device detection line 7600 and an output signal of the USB device detection line 7600, for example, a voltage level may be converted from the low level Ground to the high level Vcc.

In operation 3240, the output terminal of the connection sensor 1500 may output a change in an output signal, for example, a voltage level, to the first GPIO port GPIO1. When a voltage level of the USB device detection line 7600 according to various embodiments is converted from the high level Vcc to the low level Ground, a control circuit may recognize that connection between the receptacle 1000 and the external connector 2000 is released.

In operation 3250, the control circuit may apply a control signal to the current supply 7800 according to a voltage level detected from the USB device detection line 7600. In the current supply 7800 according to various embodiments, when a voltage level of the USB device detection line 7600 is converted from the low level Ground to the high level Vcc, the current supply 7800 may be deactivated by the control signal SE_EN of the controller 121.

In operation 3260, as the current supply 7800 is deactivated, connection between the first and second receptacle pins No. 5 CC1 and CC2 that are the identification terminal USB_ID and the current supply 7800 may be disconnected. Therefore, a predetermined current may not be applied to the identification terminal USB_ID, and a point in time when the predetermined current is applied to the identification terminal USB_ID may be limited to a point in time when the current supply 7800 is activated by the control signal SE_EN of the controller 121, that is, a point in time when the receptacle 1000 and the external connector 2000 are connected to each other.

According to various embodiments, a method of controlling a USB interface may include: inserting an external connector into a receptacle; contacting, by a connector provided in the external connector, to a connection sensor provided in the receptacle; changing an output signal at an output terminal of the connection sensor; outputting a change of the output signal to a controller; applying, by the controller, a control signal to a current supply; and applying, by the current supply, a current to an identification terminal.

According to various embodiments, the method of controlling a USB interface may further include: determining an insertion direction of the external connector; and determining whether an external device connected to the external connector and an external device connected to the receptacle operate as either a USB host or a USB device.

According to various embodiments, the output signal may be a voltage level applied to the connection sensor.

According to various embodiments, the method of controlling a USB interface may include: detaching an external connector from a receptacle; releasing contact between a connector in the external connector and a connection sensor in the receptacle; changing an output signal at an output terminal of the connection sensor; outputting a change of the output signal to a controller; applying, by the controller, a control signal to a current supply; and interrupting, by the current supply, a current supplied to an identification terminal.

Figure 11A:
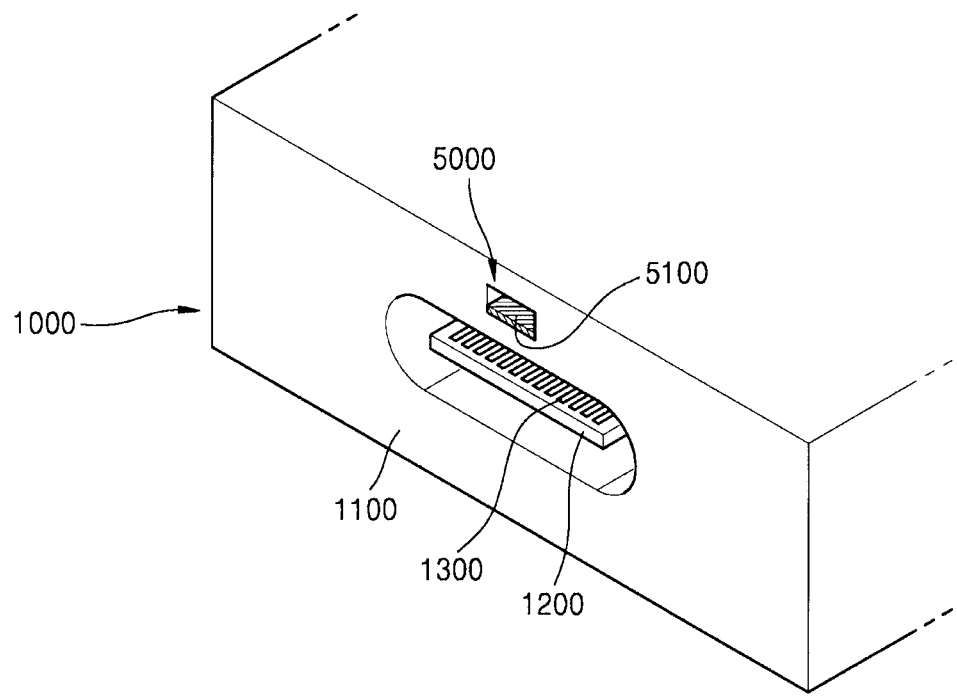
FIG. 11A is a front view of a receptacle according to various embodiments of the present disclosure.
Figure 11B:
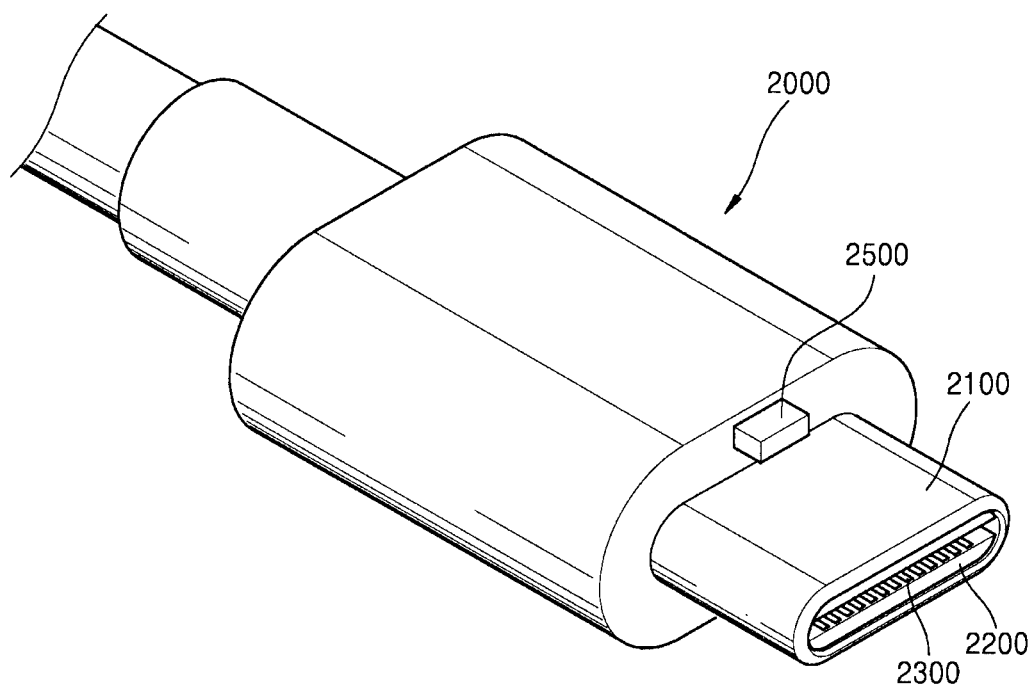
FIG. 11B is a front view of an external connector according to various embodiments of the present disclosure.

FIG. 11A is a front view of a receptacle according to various embodiments of the present disclosure. FIG. 11B is a front view of an external connector according to various embodiments of the present disclosure.

As shown in FIG. 7, an output terminal of the connection sensor 1500 according to various embodiments may output a change in a voltage level to the first GPIO port GPIO1, and when a voltage level of the USB device detection line 7600 is converted from the high level Vcc to the low level Ground, a control circuit may recognize that the external connector 2000 is connected to the receptacle 1000. The connection sensor 1500 capable of sensing contact between the connector 2500 and the external connector 2000 may be implemented as a separate terminal separated from the ground pin GND in the receptacle 1000.

Referring to FIGS. 11A and 11B, the connection sensor 1500 according to various embodiments may be an external terminal unit 5000 formed in a part of the housing 1100 of the receptacle 1000. For example, the external terminal unit 5000 may be a DIP terminal unit separated from the ground pin GND of the receptacle 1000.

As an example, when the external terminal unit 5000 is implemented as a DIP terminal unit, the external terminal unit 5000 may include an external terminal 5100 arranged to be exposed to the outside. Here, the external connector 2000 may be provided with the connector 2500 corresponding to the external terminal 5100, and when the receptacle 1000 and the external connector 2000 are connected to each other, the external terminal 5100 and the connector 2500 may be in contact with each other. Although a position of the external terminal unit 5000 is arranged in a part of the housing 1100 in the present embodiment, the present disclosure is not limited to thereto. When the receptacle 1000 and the external connector 2000 are connected to each other, the external terminal unit 5000 and the connector 2500 may be arranged at any position of the electronic device so that the external terminal unit 5000 and the connector 2500 can be in contact with each other.

When the external terminal 5100 is in contact with the connector 2500 connected to ground, a voltage level of the USB device detection line 7600 connected to the connection sensor 1500 may be converted from the high level Vcc to the low level Ground. The output terminal of the connection sensor 1500 may output a change in the voltage level to the first GPIO port GPIO1, and when a voltage level of the USB device detection line 7600 is converted from the high level Vcc to the low level Ground, the control circuit may recognize that the external connector 2000 is connected to the receptacle 1000. Since a control method by a control circuit described later below is substantially the same as that provided in the above-described embodiments, the description thereof will be omitted here for convenience of explanation.

Figure 12A:
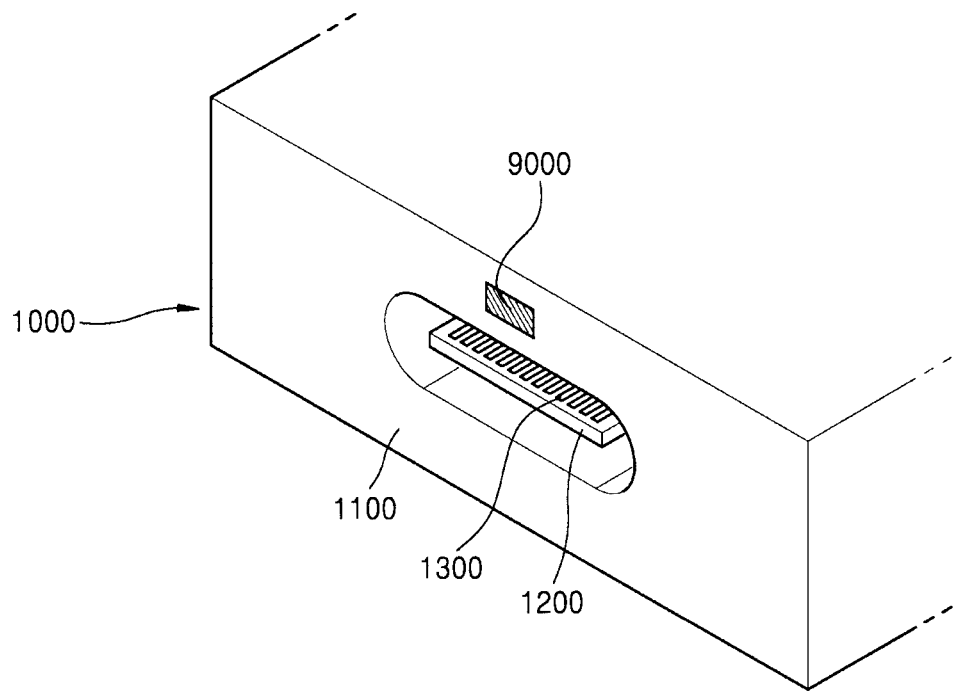
FIG. 12A is a front view of a receptacle according to various embodiments of the present disclosure.
Figure 12B:
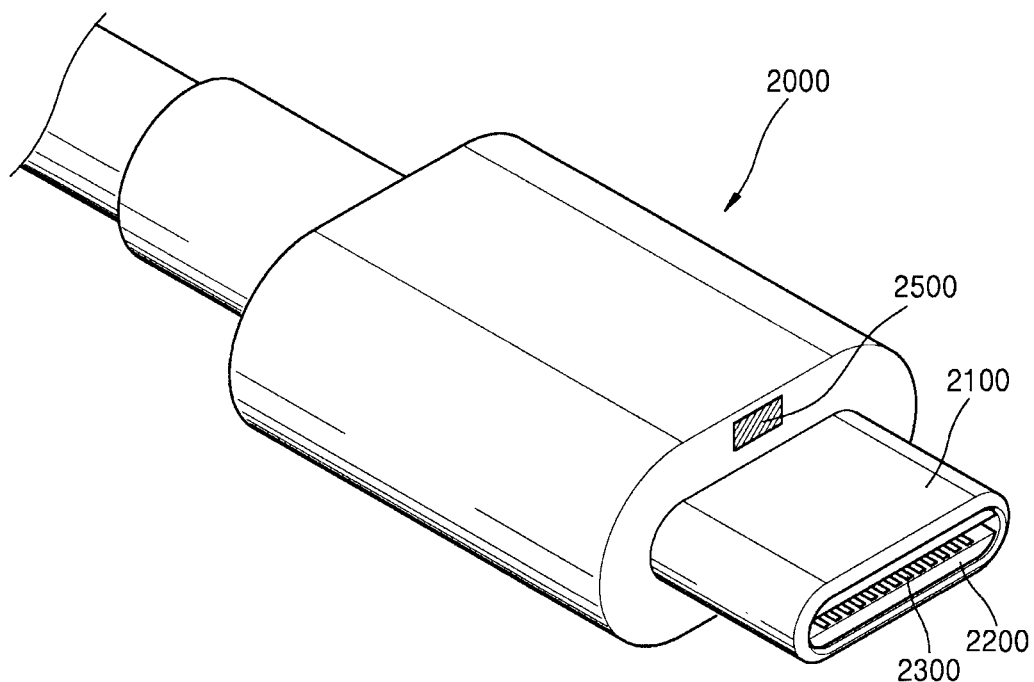
FIG. 12B is a front view of an external connector according to various embodiments of the present disclosure.
Figure 13:
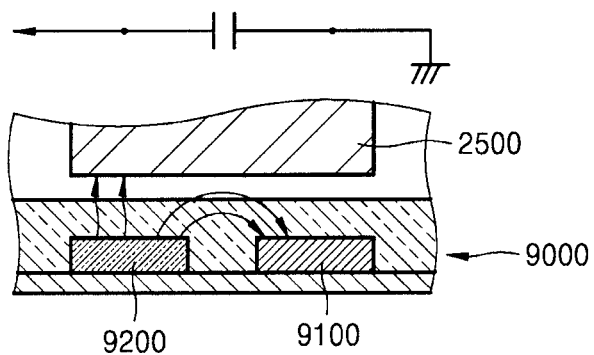
FIG. 13 is a schematic view of a connection sensor according to various embodiments of the present disclosure.

FIG. 12A is a front view of a receptacle according to various embodiments of the present disclosure. FIG. 12B is a front view of an external connector according to various embodiments of the present disclosure. FIG. 13 is a schematic view of a connection sensor according to various embodiments of the present disclosure.

As described with reference to FIG. 7, the connection sensor 1500 according to various embodiments may sense connection between the receptacle 1000 and the external connector 2000 by making contact with the connector 2500 in the external connector 2000. However, the various embodiments are not limited thereto, the connection sensor 1500 may sense the connection between the receptacle 1000 and the external connector 2000 even in a non-contact manner in which the connection sensor 1500 and the connector 2500 are in a non-contact state.

Referring to FIGS. 12A to 13, the connection sensor 1500 according to various embodiments may be a non-contact proximity sensor 9000, wherein the non-contact proximity sensor 9000 may be, for example, a capacitance sensor.

As an example, when the non-contact proximity sensor 9000 is implemented as a capacitance sensor, the non-contact proximity sensor 9000 may include a first electrode 9100 and a second electrode 9200. As an example, the first electrode 9100 may be grounded to be a reference voltage unit in a ground state, and the second electrode 9200 may be a measurer for measuring voltage or capacitance. Here, the external connector 2000 may be provided with a connector 2500 corresponding to the first and second electrodes 9100 and 9200. As an example, the connector 2500 may be formed of a conductor. In the various embodiments, the connector 2500 is implemented as a part of the housing 2100, but the present disclosure is not limited thereto. As an example, when the non-contact proximity sensor 9000 is a capacitive sensor and the connector 2500 is formed of a conductor, the non-contact proximity sensor 9000 and the connector may be arranged at any position close to the receptacle 1000 and the external connector 2000 when the receptacle 1000 is in contact with the external connector 2000.

When the receptacle 1000 and the external connector 2000 are connected to each other so that the connector 2500 faces the first and second electrodes 9100 and 9200, the connector 2500 becomes a new conductive plate. Accordingly, an electric field is formed between the connector 2500 and the second electrode 9200, and capacitance measured at the second electrode 9200 may be changed. Here, an output terminal of the connection sensor 1500 may output a change in the capacitance to the first GPIO port GPIO1, and when the capacitance measured at the second electrode 9200 changes, the control circuit may recognize that the external connector 2000 is connected to the receptacle 1000. Since a control method by a control circuit described later below is substantially the same as that provided in the above-described embodiments, the description thereof will be omitted here for convenience of explanation.

It should be understood that an electronic device supporting a USB interface and a method of operating the same according to various embodiments described herein should be considered in a descriptive sense only and not for purposes of limitation. Descriptions of features or aspects within each example embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

The invention claimed is:

1. An electronic device supporting a universal serial bus (USB) interface, the electronic device comprising:
 a housing;
 an opening provided in a part of the housing;
 a receptacle, arranged in at least a part of the inside of the opening, comprising a first surface and a second surface that are parallel to each other, and a plurality of first receptacle pins and a plurality of second receptacle pins respectively arranged on the first surface and the second surface, wherein the plurality of first receptacle pins and the plurality of second receptacle pins are symmetrically arranged with respect to a center portion of the receptacle; and
 a control circuit, electrically connected to at least one of the plurality of first receptacle pins and the plurality of second receptacle pins, configured to:
  sense whether an external connector comprising first external connector pins and second external connector pins symmetrical to each other is inserted into the receptacle, by detecting a voltage drop at a connection sensor,
  responsive to detecting the voltage drop at the connection sensor, apply a predetermined current to any one of the plurality of first receptacle pins and the plurality of second receptacle pins,
  monitor the predetermined current, and
  sense a connection between one of the first external connector pin and one of the plurality of first receptacle pins and the plurality of second receptacle pins according to the monitored predetermined current.

2. The electronic device of claim 1, wherein the USB interface is of a C type.

3. The electronic device of claim 2, wherein at least one of the plurality of first receptacle pins and the plurality of second receptacle pins has an identification terminal.

4. The electronic device of claim 3, wherein each of the plurality of first receptacle pins and the plurality of second receptacle pins comprises twelve receptacle pins, and the identification terminal is arranged at the fifth position from any one of opposite end portions of the plurality of first receptacle pins and the plurality of second receptacle pins.

5. An electronic device supporting a universal serial bus (USB) interface, the electronic device comprising:
 a receptacle into which an external connector to which an external device is connected is inserted, and comprising an identification terminal for identifying the external device;
 a connection sensor configured to sense the insertion of the external connector to the receptacle; and
 a control circuit configured to control a current supplied to the identification terminal depending on whether the external connector is inserted or not.

6. The electronic device of claim 5, wherein the connection sensor is configured to sense the insertion of the external connector to the receptacle by contact between the receptacle and the external connector.

7. The electronic device of claim 6, further comprising:
 a first fastener fastened to a second fastener provided on the external connector and fixing the external connector to the receptacle,
 wherein a predetermined voltage is applied to the first fastener, and the connection sensor is configured to sense the insertion of the external connector to the receptacle according to a voltage change of the first fastener generated when the first fastener and the second fastener are in contact with each other.

8. The electronic device of claim 6, further comprising:
 an external terminal unit separated from a ground pin provided in the receptacle,
 wherein a predetermined voltage is applied to the external terminal unit and the connection sensor is configured to sense the insertion of the external connector to the receptacle according to a voltage change of the external terminal unit generated when the external terminal unit and a portion of the receptacle are in contact with each other, and
 the receptacle comprises a housing with a front entrance, and the external terminal unit is provided in the housing.

9. The electronic device of claim 8, wherein the external terminal unit is a dual inline package (DIP) terminal unit.

10. The electronic device of claim 5, wherein the connection sensor is configured to sense the insertion of the external connector to the receptacle in a non-contact manner.

11. The electronic device of claim 10, wherein the connection sensor is a capacitance sensor,
 wherein the capacitance sensor comprises at least one electrode for which a predetermined capacitance is measured, and
 the connection sensor is configured to sense the insertion of the external connector to the receptacle according to a change in the predetermined capacitance generated when the external connector is close to the receptacle.

12. A method of controlling a universal serial bus (USB) interface, the method comprising:
 inserting an external connector into a receptacle;
 contacting, by a connector provided in the external connector, to a connection sensor provided in the receptacle
 changing an output signal at an output terminal of the connection sensor;
 outputting a change of the output signal to a controller;
 applying, by the controller, a control signal to a current supply; and applying, by the current supply, a current to an identification terminal.

13. The method of claim 12, further comprising:
determining an insertion direction of the external connector; and
determining whether an external device connected to the external connector and an external device connected to the receptacle operate as either a USB host or a USB device.

14. The method of claim 12, wherein the output signal is a voltage level applied to the connection sensor.

15. A method of controlling a universal serial bus (USB) interface, the method comprising:
detaching an external connector from a receptacle;
releasing contact between a connector in the external connector and a connection sensor in the receptacle;
changing an output signal at an output terminal of the connection sensor;
outputting a change of the output signal to a controller;
applying, by the controller, a control signal to a current supply; and
interrupting, by the current supply, a current supplied to an identification terminal.

\* \* \* \* \*